(12) United States Patent
Sumida

(10) Patent No.: US 12,200,879 B2
(45) Date of Patent: Jan. 14, 2025

(54) DISPLAY DEVICE

(71) Applicant: SATURN LICENSING LLC, New York, NY (US)

(72) Inventor: Masanori Sumida, Saitama (JP)

(73) Assignee: SATURN LICENSING LLC, New York, NY (US)

( * ) Notice: Subject to any disclaimer, the term of this patent is extended or adjusted under 35 U.S.C. 154(b) by 211 days.

(21) Appl. No.: 17/910,177

(22) PCT Filed: Feb. 16, 2021

(86) PCT No.: PCT/JP2021/005733
§ 371 (c)(1),
(2) Date: Sep. 8, 2022

(87) PCT Pub. No.: WO2021/199743
PCT Pub. Date: Oct. 7, 2021

(65) Prior Publication Data
US 2023/0100766 A1  Mar. 30, 2023

(30) Foreign Application Priority Data

Mar. 31, 2020  (JP) .................................. 2020-065174

(51) Int. Cl.
| | | |
|---|---|---|
| *H05K 5/02* | (2006.01) | |
| *H05K 5/03* | (2006.01) | |
| *H05K 7/20* | (2006.01) | |

(52) U.S. Cl.
CPC ............. *H05K 5/0213* (2013.01); *H05K 5/03* (2013.01); *H05K 7/20954* (2013.01)

(58) Field of Classification Search
CPC ..... H05K 2201/10106; H05K 7/20145; H05K 7/20972; H05K 7/20136; H05K 5/0213;
(Continued)

(56) References Cited

U.S. PATENT DOCUMENTS 5,547,272 A * 8/1996 Paterson ................. G06F 1/181
312/265.5
6,477,055 B1 * 11/2002 Bolognia ........... H05K 7/20727
312/223.1
(Continued)

FOREIGN PATENT DOCUMENTS

| JP | 2011095772 A | 5/2011 |
| JP | 2013134418 A | 7/2013 |
| JP | 2014228802 A | 12/2014 |

OTHER PUBLICATIONS

International Search Report for PCT/JP2021/005733 dated Apr. 27, 2021. 3 pgs.

*Primary Examiner* — Adam B Dravininkas
(74) *Attorney, Agent, or Firm* — Richard LaPeruta

(57) ABSTRACT

A display device according to the present technology includes: a plurality of linear portions that, when three directions orthogonal to each other are a first direction, a second direction, and a third direction, extends in the first direction and is positioned apart from each other in the second direction; and a connecting portion that connects respective parts of two linear portions adjacent to each other in the second direction. The linear portion and the connecting portion are integrally formed by injection molding, the linear portion has a base extending in the first direction and a pair of protrusions protruding in the third direction from both end portions of the base in the second direction, and both end portions of the connecting portion are continuous to respective tip portions of the protrusions of the two adjacent linear portions.

17 Claims, 18 Drawing Sheets

(58) Field of Classification Search
CPC .... H05K 5/03; H05K 5/0217; H05K 7/20181; H05K 7/20954; B29L 2031/3475; G06F 1/20; G06F 1/1601; G06F 1/203; G06F 1/1616; G09F 9/00; H04N 9/3144; H04N 9/3141; H04N 23/51; H04N 5/64
See application file for complete search history.

(56) References Cited

U.S. PATENT DOCUMENTS

| | | | |
|---|---|---|---|
| 6,826,057 B1* | 11/2004 | Gundogan | H05K 7/1425 361/726 |
| 2002/0041484 A1* | 4/2002 | Lajara | G06F 1/20 361/679.48 |
| 2003/0164926 A1* | 9/2003 | Nakano | H04N 9/3141 348/E5.143 |
| 2005/0157457 A1 | 7/2005 | Kim | |
| 2006/0070280 A1* | 4/2006 | Yamamura | H04N 5/64 40/564 |
| 2007/0127208 A1* | 6/2007 | Shin | H05K 7/20963 313/46 |
| 2010/0271361 A1* | 10/2010 | Hiradate | H04N 5/64 361/679.01 |
| 2013/0163200 A1* | 6/2013 | Takahashi | H05K 7/20972 361/695 |
| 2013/0321710 A1* | 12/2013 | Kawasoe | H04N 5/64 348/731 |
| 2014/0347816 A1* | 11/2014 | Ogura | H04N 5/64 361/688 |

* cited by examiner

FIG. 9
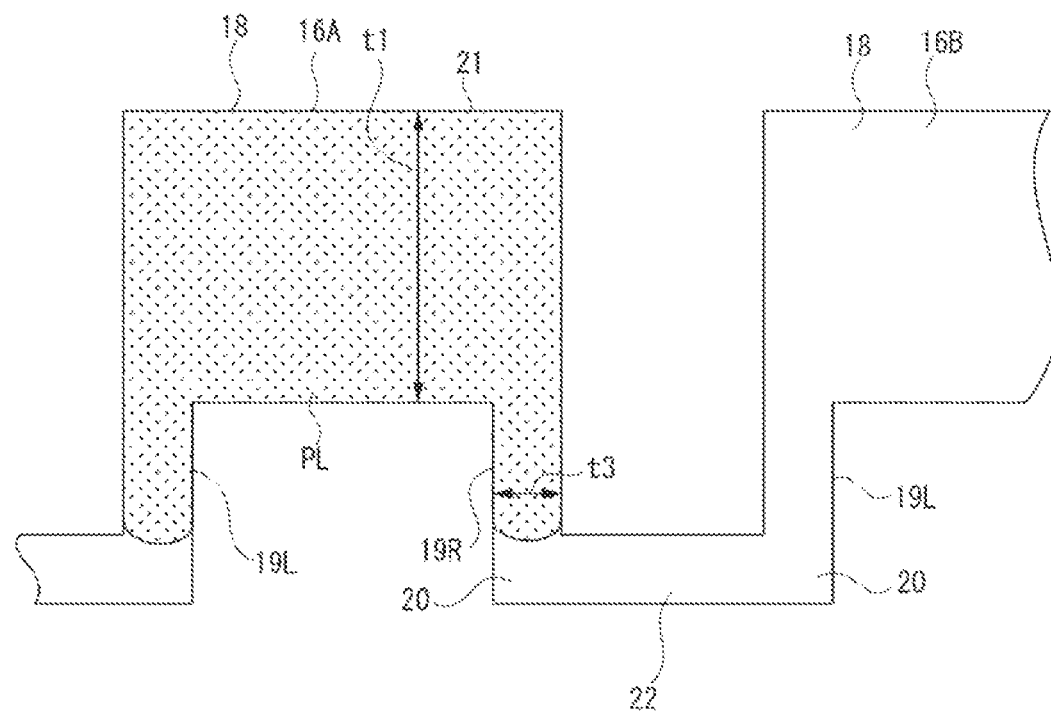
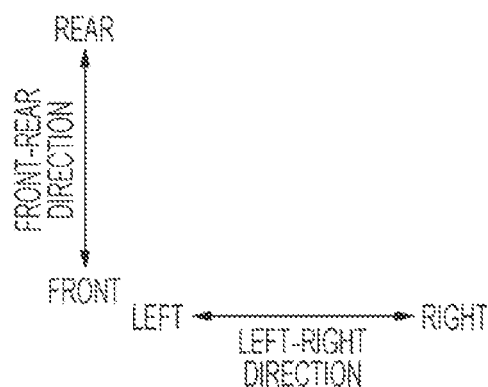

FIG. 11
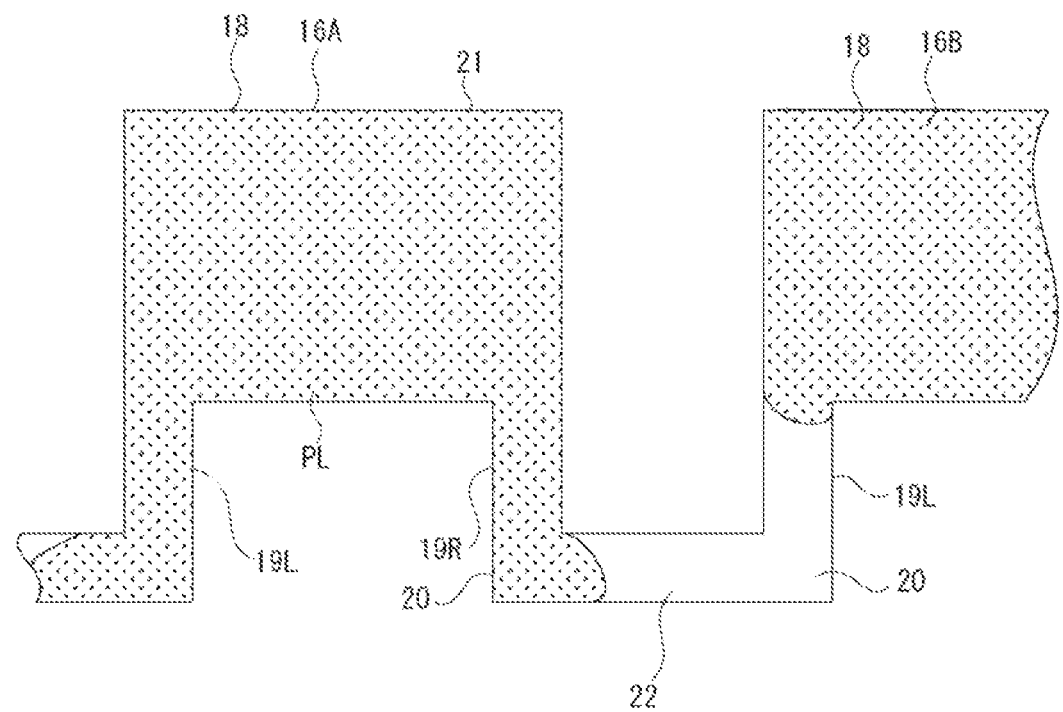
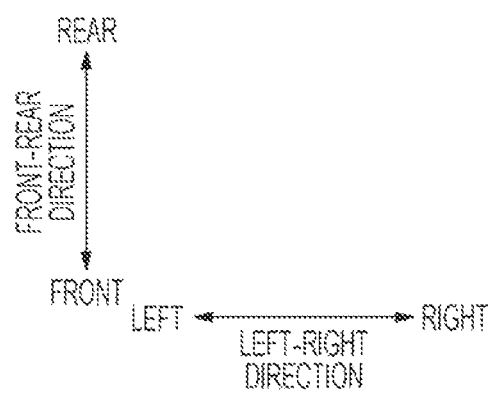

FIG. 13
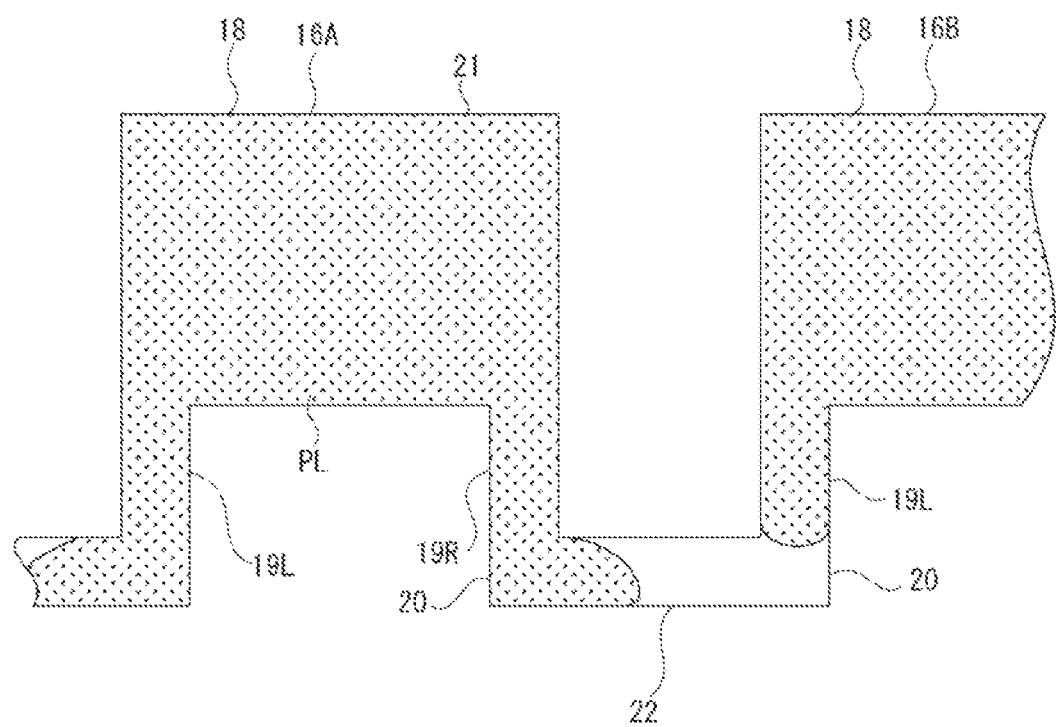
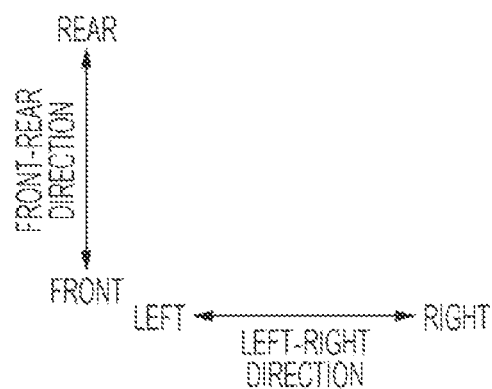

FIG. 15
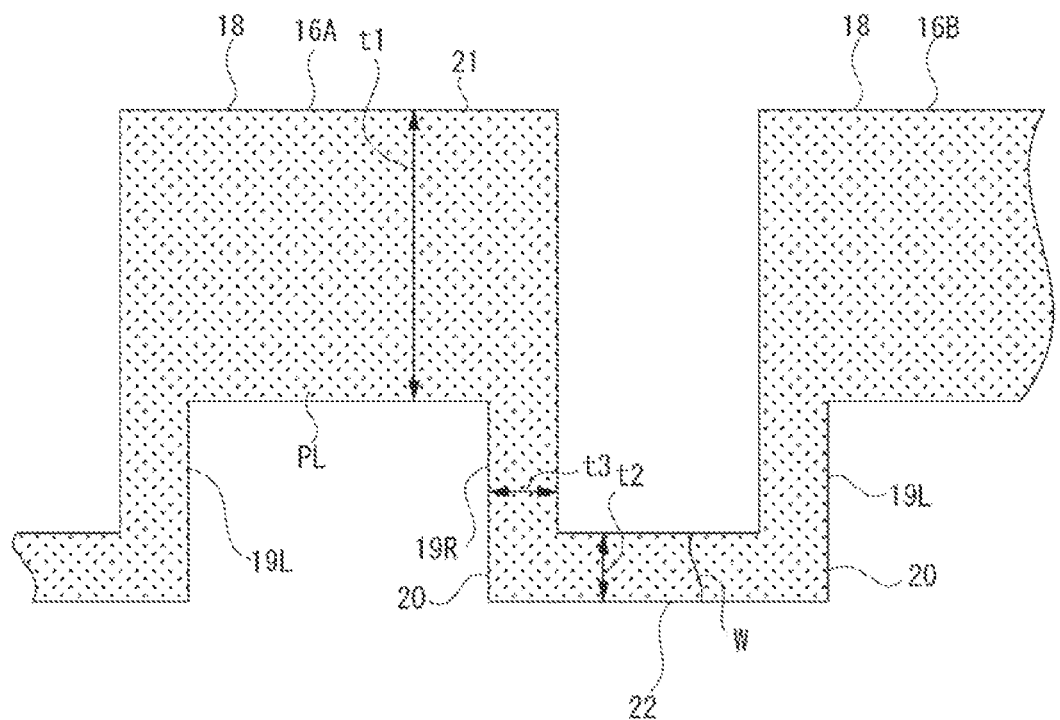
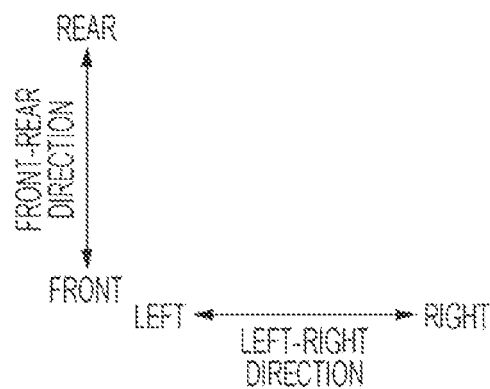

FIG. 16
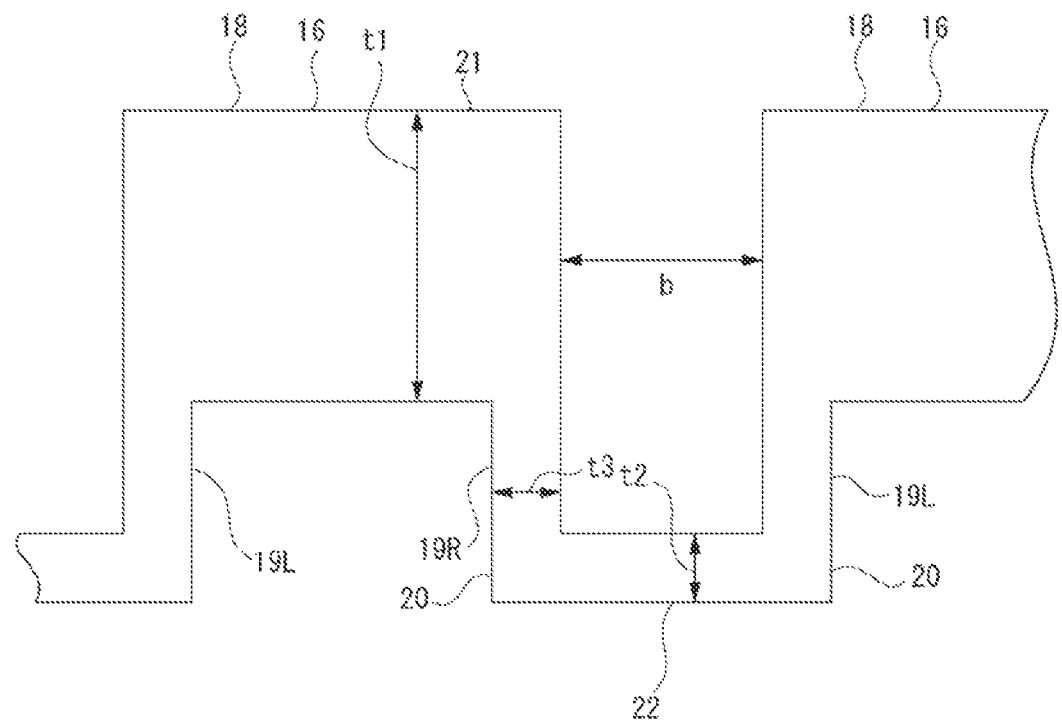
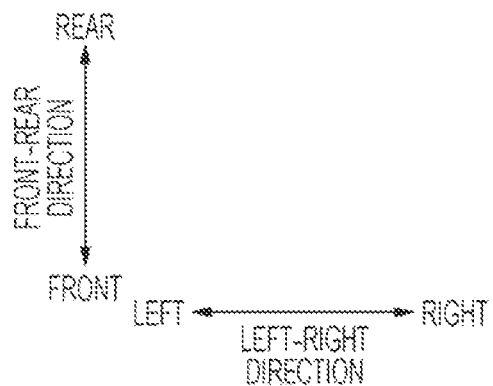

FIG. 17
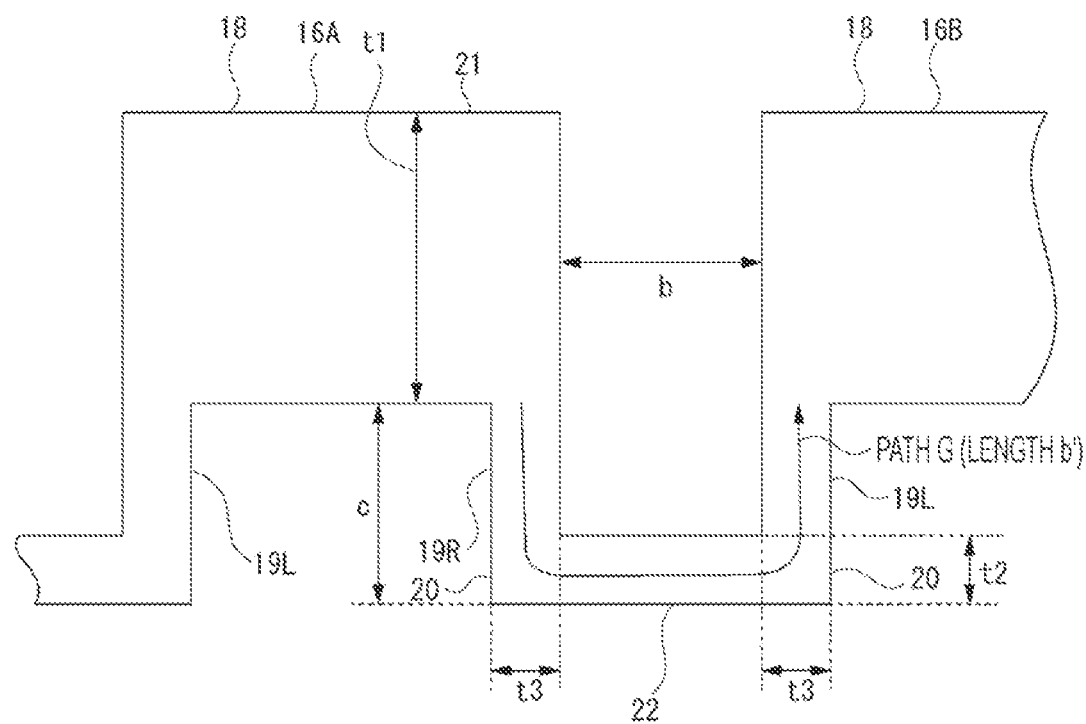
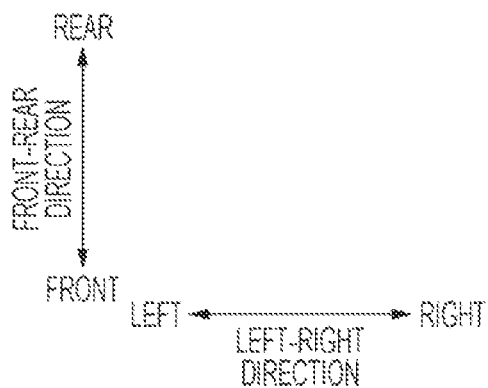

FIG. 19
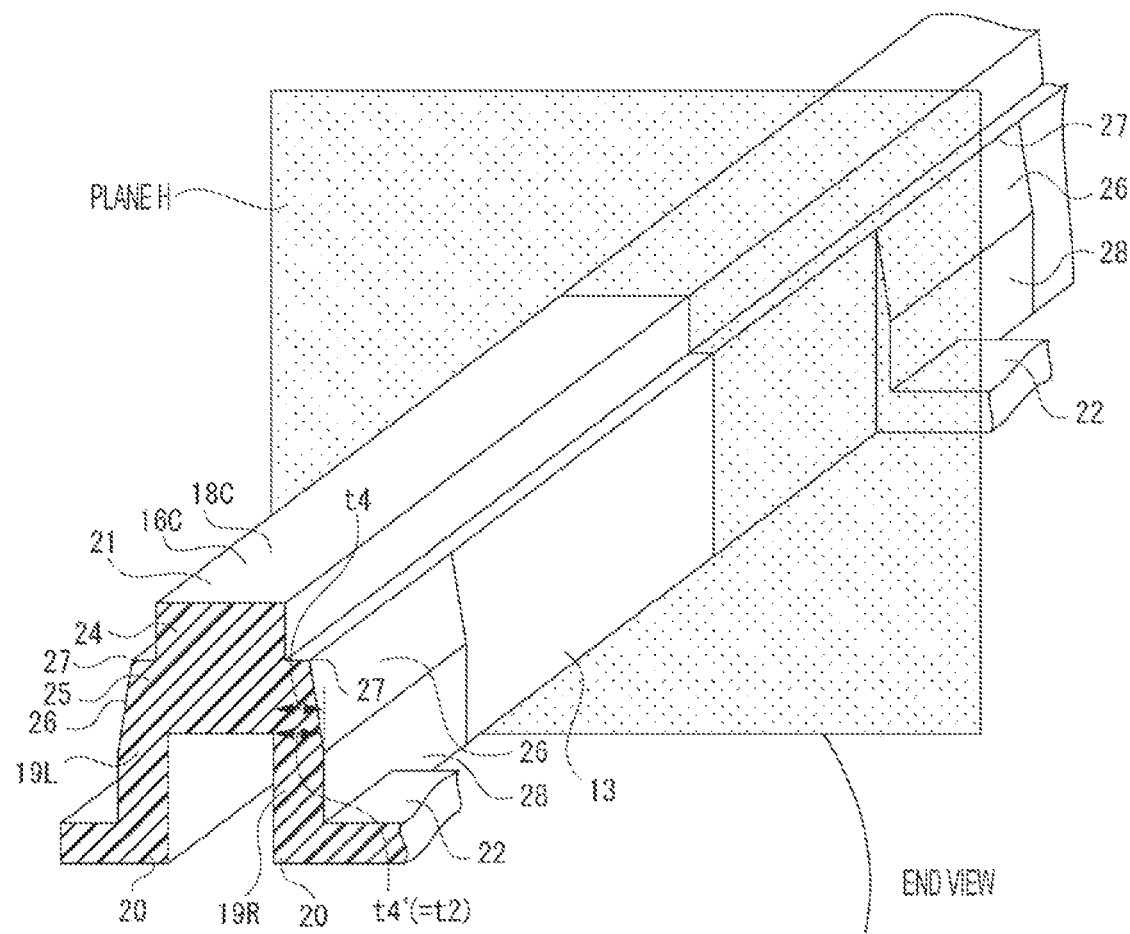
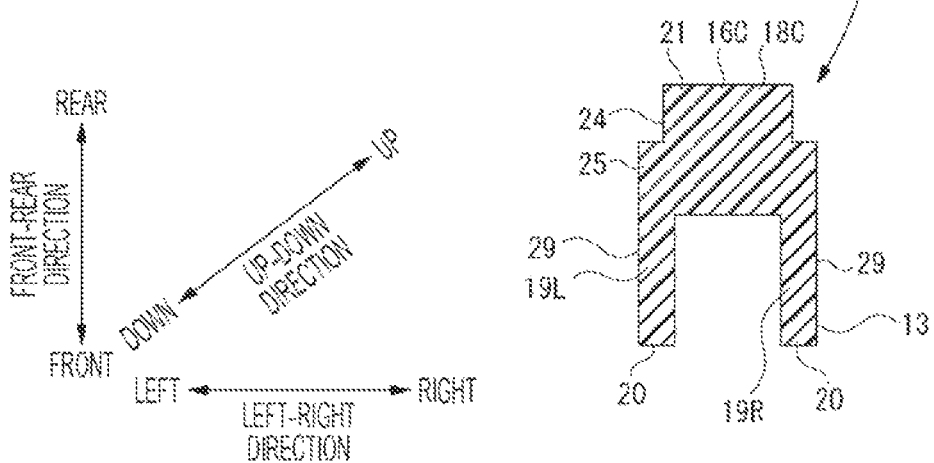

DISPLAY DEVICE

CROSS-REFERENCE TO RELATED APPLICATIONS

This application is a national phase entry under 35 U.S.C. § 371 of International Application No. PCT/JP2021/005733 filed Feb. 16, 2021, which claims the priority from Japanese Patent Application No. 2020-065174 filed in the Japanese Patent Office on Mar. 31, 2020, the entire contents of which are hereby incorporated by reference.

TECHNICAL FIELD

The present technology relates to a technology for a display device having a structure formed by injection molding.

BACKGROUND ART

Some display devices typified by televisions have a structure formed by injection molding. In such a display device, for example, a back cover which is a part of an outer casing is formed by injection molding in some cases. In the back cover, a plurality of holes for intake and exhaust of air is formed to cool heat generated inside the outer casing (see, for example, Patent Document 1). Such a portion having the plurality of holes is formed in a lattice shape.

CITATION LIST

Patent Document
  Patent Document 1: Japanese Patent Application Laid-Open No. 2011-095772

SUMMARY OF THE INVENTION

Problems to be Solved by the Invention

Meanwhile, when the lattice-shaped portion is formed by injection molding, the dividing and joining of a molten resin occur. In some cases, a weld line is formed at the junction of the molten resin.

Since the portion where the weld line is formed has a lower strength than other portions, the generation of the weld line causes cracks or defects. For example, when cracks or defects occur in an impact test of a product, a countermeasure is required.

The present technology has been made in view of such a problem, and an object thereof is to improve a strength in a portion where a hole is formed.
Solutions to Problems A display device according to the present technology includes: a plurality of linear portions that, when three directions orthogonal to each other are a first direction, a second direction, and a third direction, extends in the first direction and is positioned apart from each other in the second direction; and a connecting portion that connects respective parts of two linear portions adjacent to each other in the second direction. The linear portion and the connecting portion are integrally formed by injection molding, the linear portion has a base extending in the first direction and a pair of protrusions protruding in the third direction from both end portions of the base in the second direction, and both end portions of the connecting portion are continuous to respective tip portions of the protrusions of the two adjacent linear portions.

Therefore, a hole is formed between the linear portions. Furthermore, the flow rate of the molten resin at the time of forming the base during injection molding is made higher than the flow rate of the molten resin at the time of forming the connecting portion. Therefore, the junction (weld line) of the molten resin divided by the hole is easily formed in the connecting portion.

In the above-described display device, a plurality of the connecting portions may be provided apart from each other in the first direction.

Therefore, the strength of the linear portion is improved.

In the above-described display device, a pitch width a of the connecting portions adjacent to each other in the first direction, a length b of the connecting portion in the second direction, a thickness t1 of the base in the third direction, and a thickness t2 of the connecting portion in the third direction may satisfy a following expression:

$(t1/t2)3 > a/b$

Therefore, the weld line is easily formed in the connecting portion.

In the above-described display device, the pitch width a may be larger than the length b.

Therefore, a space surrounded by the linear portions and the connecting portions is an elongated hole.

In the above-described display device, the thickness t1 may be larger than the thickness t2.

Therefore, the flow speed of the molten resin at the time of forming the connecting portion is made slower than the flow speed of the molten resin at the time of forming the base of the linear portion.

In the above-described display device, the thickness t1 may be larger than the thickness t3 of the protrusion in the second direction.

Therefore, the flow speed of the molten resin at the time of forming the protrusion is made slower than the flow speed of the molten resin at the time of forming the base of the linear portion.

In the above-described display device, the thickness t2 and the thickness t3 may be the same thickness.

Therefore, the thickness of either the connecting portion or the protrusion may not be excessively reduced.

In the above-described display device, at least parts of outer surfaces of the linear portion on both sides in the second direction may be formed as inclined surfaces which approach each other in the second direction with increasing distance from the connecting portion in the third direction.

Therefore, the cross-sectional area of the space in which the continuous portion between the base and the protrusion is formed in the mold used for injection molding is reduced, and the molten resin hardly flows into the protrusion.

The above-described display device further includes: a back cover that is disposed on a rear side of the display panel. The linear portion and the connecting portion may be provided in the back cover.

Therefore, the weld line is easily formed in the connecting portion in the back cover.

In the above-described display device, the base may be positioned on an outer surface side of the connecting portion.

Therefore, the connecting portion where the weld line is easily formed is positioned closer to the internal space side of the display device than the base.

In the above-described display device, a space surrounded by the adjacent linear portions and the connecting portions adjacent to each other in the first direction may be formed as an intake and exhaust hole.

Therefore, heat generated from the electronic substrate or the like can be discharged from the intake and exhaust hole, and the strength of the structure for forming the intake and exhaust hole can be maintained at a certain level or more.

BRIEF DESCRIPTION OF DRAWINGS

FIG. 9 is an end view taken along line F-F in FIG. 8.

FIG. 11 is an end view taken along line F-F in FIG. 10.

FIG. 13 is an end view taken along line F-F in FIG. 12.

FIG. 15 is an end view taken along line F-F in FIG. 14.

FIG. 16 is an end view illustrating a thickness of a base, a thickness of a protrusion, and a thickness of a connecting portion.

FIG. 17 is an end view for describing an example in consideration of a time during which the molten resin flows through the protrusion.

FIG. 19 is a cross-sectional view and an end view illustrating a linear portion and a connecting portion in a modification.

MODE FOR CARRYING OUT THE INVENTION

Hereinafter, an embodiment will be described in the following order.

<1. Configuration of Display Device>
<2. Structure of Back Cover>
<3. Molding process of back cover in injection molding>
<4. Pressure loss of molten resin>
<5. Exemplary dimensions>
<6. Modification>
<7. Summary>
<8. Present technology>

<1. Configuration of Display Device>

Figure 1:
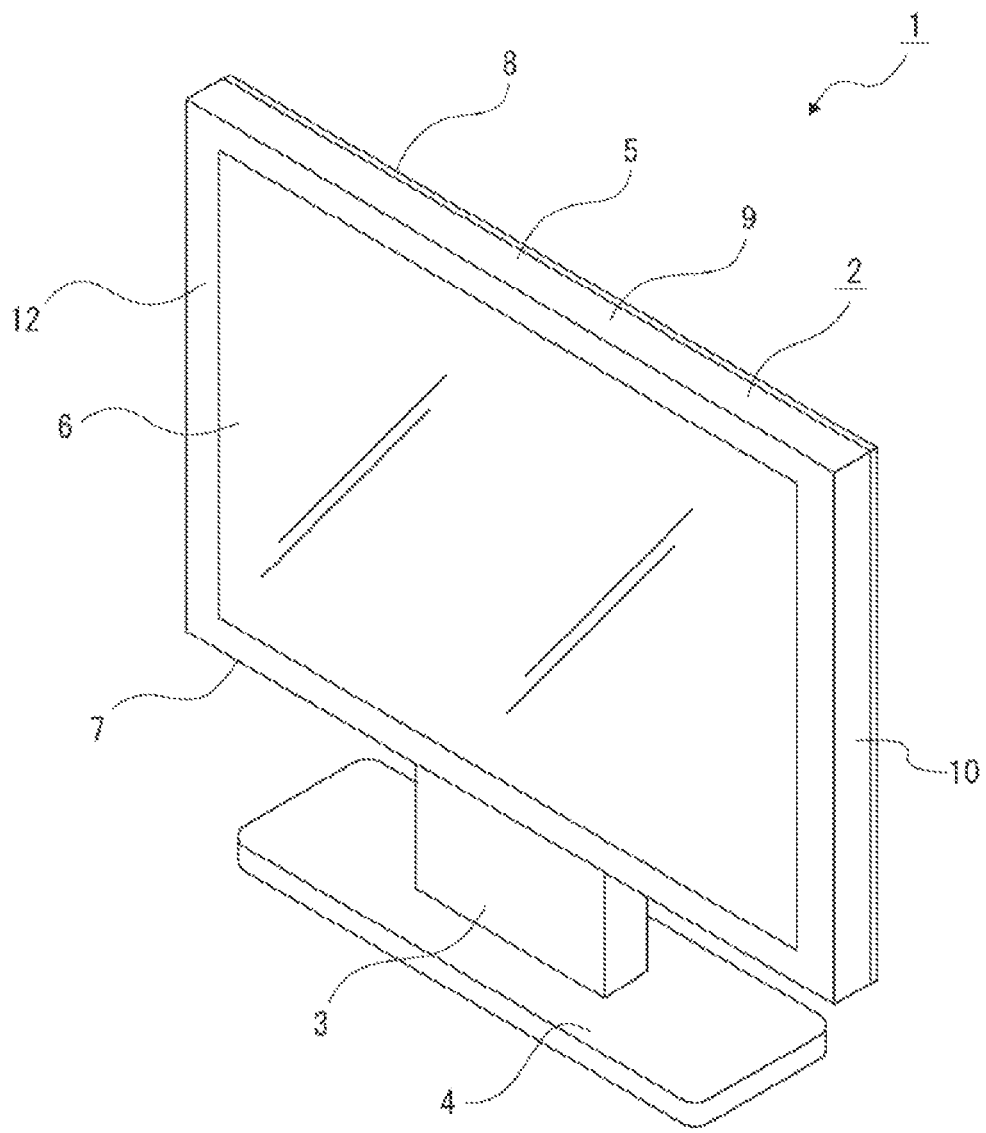
FIG. 1 is a perspective view of a display device.
Figure 2:
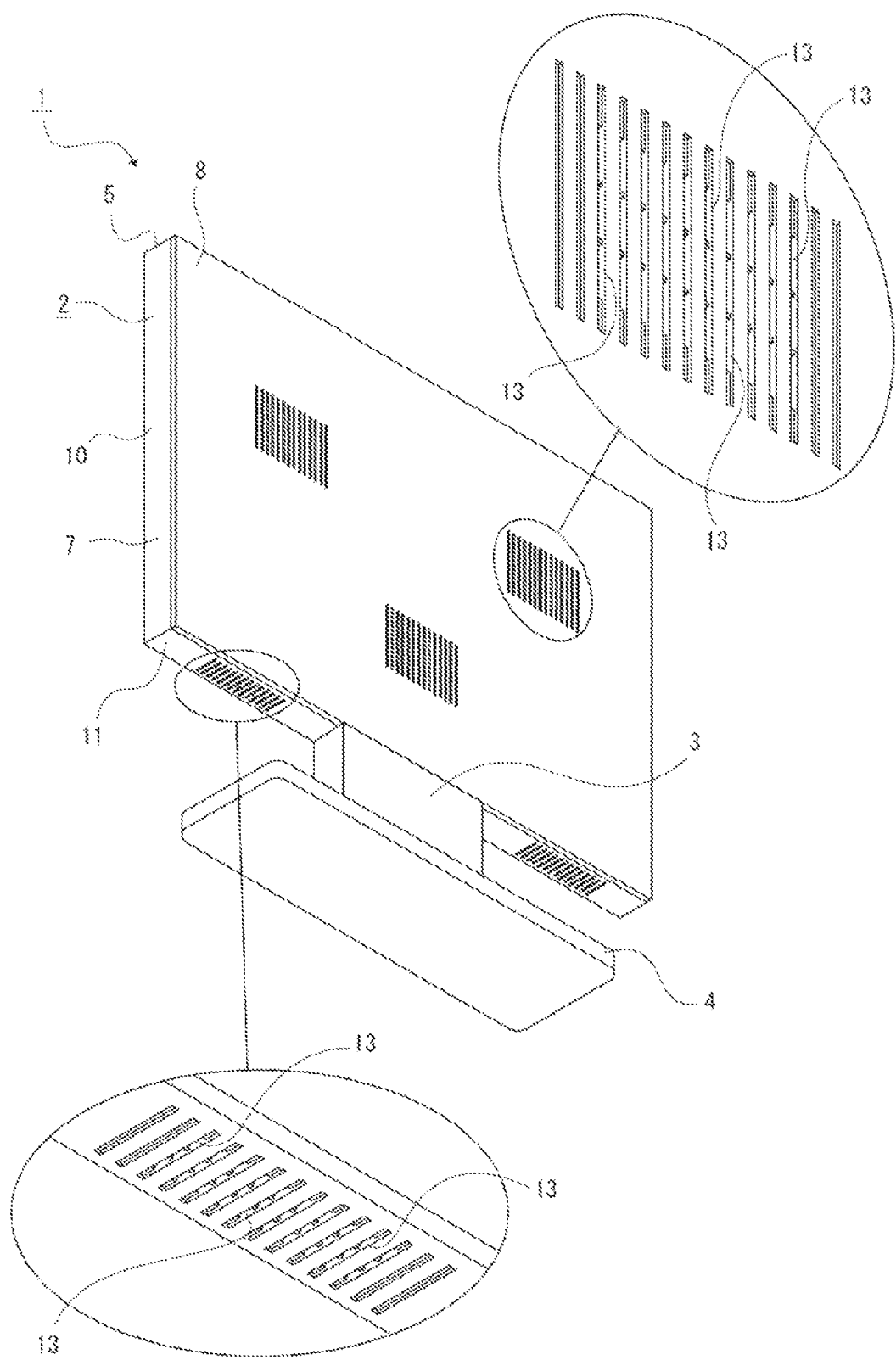
FIG. 2 is a perspective view of the display device in a direction different from that in FIG. 1.

A configuration of a display device 1 of the present technology will be described with reference to FIGS. 1 and 2. Note that the display device 1 is a device, such as a television device or a monitor device, on which a video or an image is displayed.

The display device 1 includes a display unit 2 having a substantially rectangular shape, a support unit 3 attached to a rear surface portion of the display unit 2 and extending in an up-down direction, and a pedestal portion 4 to which a lower end portion of the support unit 3 is attached and which has a flat shape in a horizontal direction in order to stabilize postures of the display unit 2 and the support unit 3.

In the following description, a front-rear direction will be described with a user side viewing a video (image) shown on the display device 1 as a front side. Furthermore, in some cases, a gravity direction is described as the up-down direction, and the horizontal direction is described as a left-right direction. Note that, as the left-right direction, a direction viewed from the back surface side of the display device 1 is used.

Note that a "first direction", a "second direction", and a "third direction" in the claims are the up-down direction, the left-right direction, and the front-rear direction described above, respectively. However, these directions are set according to the opening direction of an intake and exhaust hole described later. Specifically, since the intake and exhaust hole described in the present embodiment are a hole opened rearward, the first direction is the up-down direction.

For example, in a case where the intake and exhaust hole is a hole opened downward, the first direction is the front-rear direction, the second direction is the left-right direction, and the third direction is the up-down direction.

Note that these directions are merely for convenience of description, and in implementation of the present technology, the invention is not limited to these directions.

The display unit 2 includes an outer casing portion 5 in which each unit such as an electronic circuit for displaying an image and the like is housed and which has an opening opened forward, and a display panel 6 on which the image and the like are displayed and which is disposed such that the image and the like can be seen from the front through the opening of the outer casing portion 5.

The outer casing portion 5 includes, for example, a bezel 7 formed as a front side portion, a back cover 8 formed as a rear side portion and positioned behind the display panel 6, and various operators (not illustrated).

The bezel 7 includes an upper surface portion 9 which faces the up-down direction and extends in the left-right direction, a pair of side surface portions 10 and 10 which face the left-right direction, continue to the both left and right end portions of the upper surface portion 9, and extend in the up-down direction, a lower surface portion 11 which faces the up-down direction and has both left and right end portions continuing to the lower end portions of the pair of side surface portions 10 and 10, and a frame-shaped portion 12 which is formed in a frame shape facing the front-rear direction. The outer peripheral portion of the frame-shaped portion 12 is continuous with each front end portion of the upper surface portion 9, the side surface portions 10 and 10, and the lower surface portion 11.

The back cover 8 is a resin member which is formed in a plate shape facing the front-rear direction by injection molding, and is attached to the rear end portion of the bezel 7 from the rear side.

The back cover 8 is provided with an intake hole for taking air into an internal space and an exhaust hole for discharging air from the internal space. Heat discharged from a substrate or the like disposed inside the display unit 2 is cooled by the intake hole and the exhaust hole. These intake hole and exhaust hole will be collectively described as an intake and exhaust hole 13.

A plurality of intake and exhaust holes 13 is provided as a hole opened rearward, a hole opened downward, a hole opened upward, and a hole opened sideways in the back cover 8. Alternatively, in addition to the intake and exhaust holes opened in these directions, the intake and exhaust holes 13 opened in an oblique direction may be used. A portion where the plurality of intake and exhaust holes 13 is formed is provided in a lattice shape.

Note that the intake and exhaust holes 13 may be provided in the bezel 7. For example, the intake and exhaust holes 13 illustrated in FIG. 2 are exemplified as holes which are formed in the back cover 8 to be opened rearward and holes which are formed in the lower surface portion 11 of the bezel 7 to be opened downward.

In the following description, the intake and exhaust holes 13 opened to the rear side of the back cover 8 will be described. Various shapes of the plurality of intake and exhaust holes 13 can be considered, but in this example, the intake and exhaust holes 13 having an elongated shape in the up-down direction are taken as an example.

The display panel 6 has a laminated structure including a diffusion plate, an optical sheet, a wiring layer, and the like.

<2. Structure of Back Cover>

Figure 3:
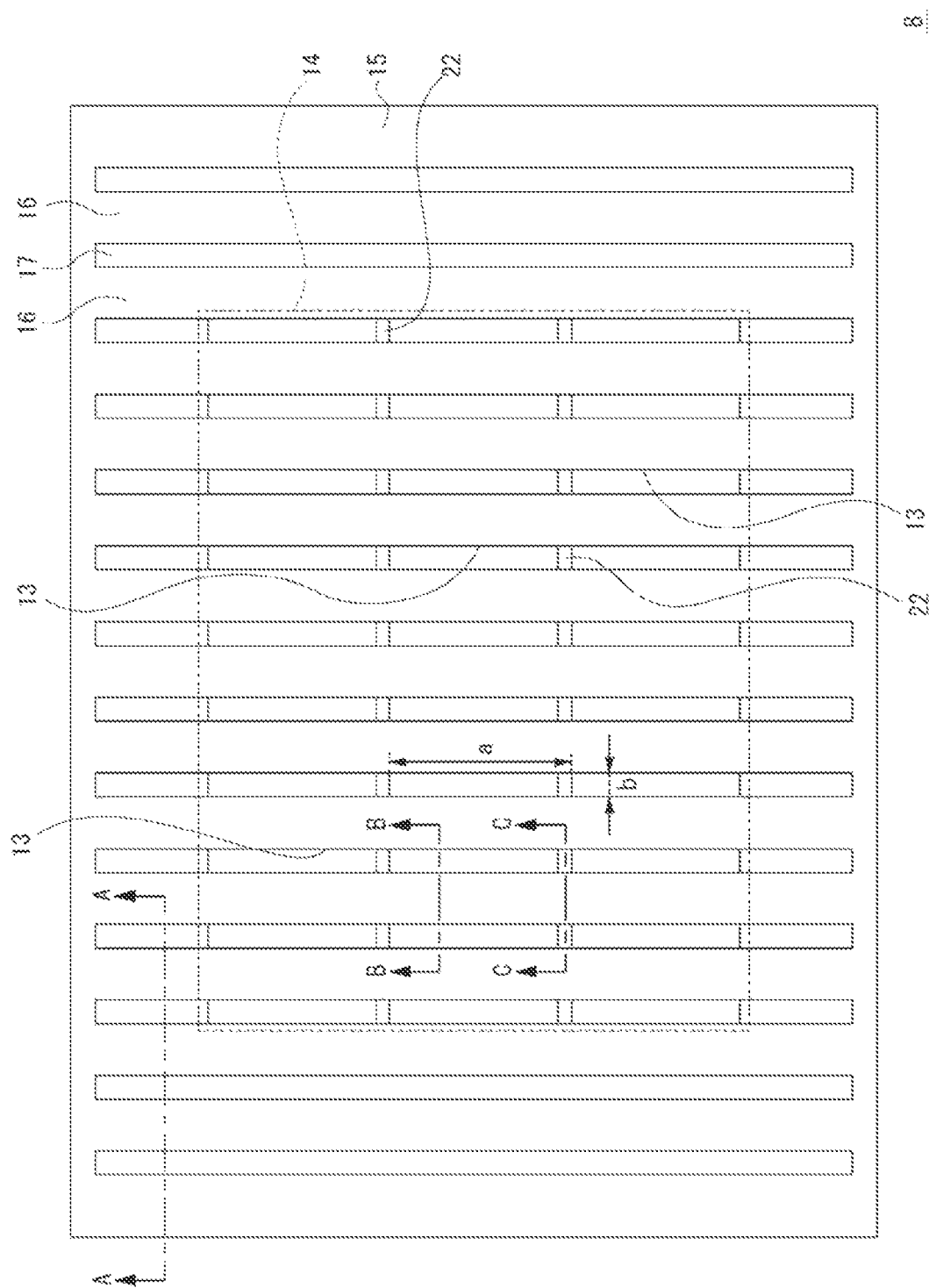
FIG. 3 is a rear view of a back cover.

A specific configuration of the back cover 8 will be described with reference to FIG. 3.

A predetermined portion of the back cover 8 includes a central portion 14 in which the plurality of intake and exhaust holes 13 is formed and an outer peripheral portion 15 which is the other portion.

A portion of the outer peripheral portion 15 excluding an outermost edge portion 15a includes a plurality of linear portions 16 extending in the up-down direction and positioned to be apart from each other in the left-right direction and a connection portion 17 positioned between the linear portions 16. A recess opened rearward is formed between the adjacent linear portions 16 and 16.

Figure 4:
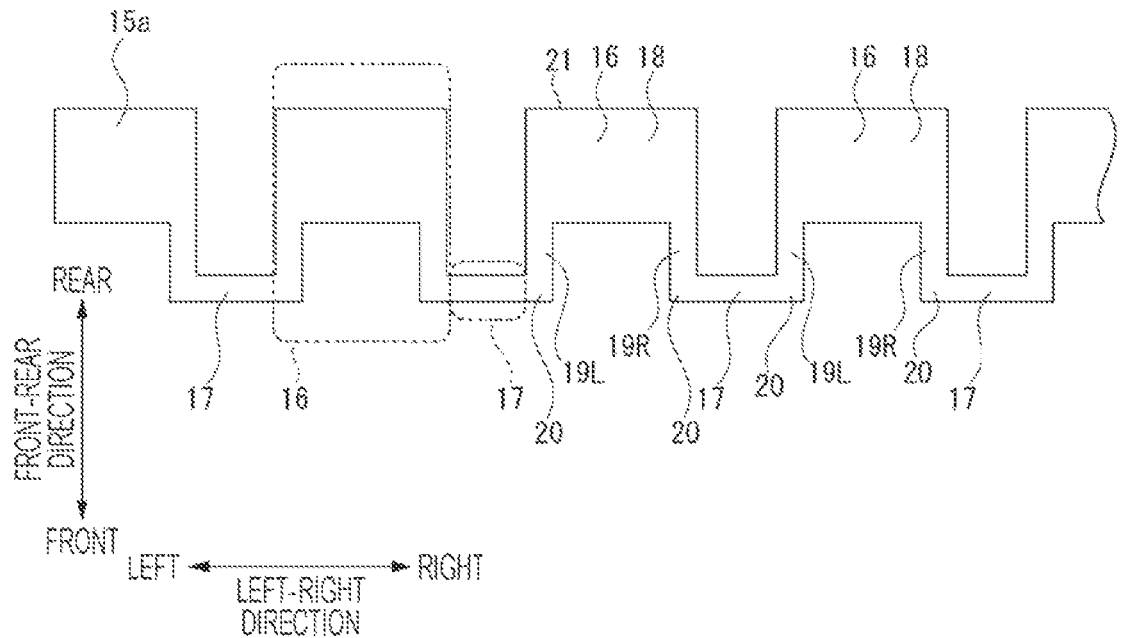
FIG. 4 is an end view taken along line A-A in FIG. 3.

Next, the linear portion 16 and the connection portion 17 will be described with reference to FIG. 4.

The linear portion 16 includes a base 18 extending in the up-down direction and having a substantially rectangular parallelepiped shape, and a pair of protrusions 19 and 19 protruding forward from both left and right end portions of the base 18 and having a substantially rectangular parallelepiped shape extending in the up-down direction. Here, the protrusion 19 protruding from the left end portion of the base 18 will be referred to as a protrusion 19L, and the protrusion 19 protruding from the right end portion will be referred to as a protrusion 19R. Note that in a case where the left and right protrusions are not distinguished, the protrusions are simply described as the protrusions 19.

Both left and right end portions of the connection portion 17 are respectively continuous with a tip portion 20 of the protrusion 19R of the linear portion 16 and a tip portion 20 of the protrusion 19L of the linear portion 16 adjacent to each other.

The rear surface of the base 18 is formed as a part of the outer surface 21 of the display device 1. The outer surface 21 is subjected to, for example, surface processing for smoothing by eliminating irregularities, emboss processing for forming irregularities, and the like. Furthermore, the outer surface 21 is also a portion to which an impact is applied in an impact test. Moreover, the outer surface 21 is one of portions to which an impact from a user or the like is likely to be applied after commercialization.

Figure 5:
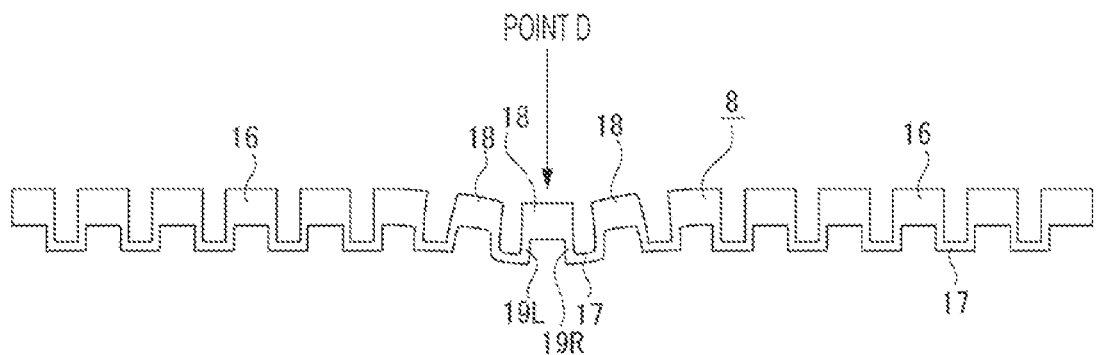
FIG. 5 is a schematic view illustrating a state where an impact is applied to an outer surface of the back cover and the back cover is elastically deformed.

In the back cover 8, the horizontal cross-sectional shape is formed to have an uneven shape (bellows shape) by the linear portion 16 and the connection portion 17. in a case where an impact is applied to the back cover 8, as illustrated in FIG. 5, in the vicinity of a point D where the impact is applied, each portion of the back cover 8 is deformed such that the adjacent bases 18 and 18 approach each other and a gap between the pair of protrusions 19L and 19R of the linear portion 16 widens.

Therefore, the impact applied to the back cover 8 is absorbed by the distortion before being transmitted to the connection portion 17 and the protrusion 19, and thus a large stress is not generated in the connection portion 17 and the protrusion 19.

Figure 6:
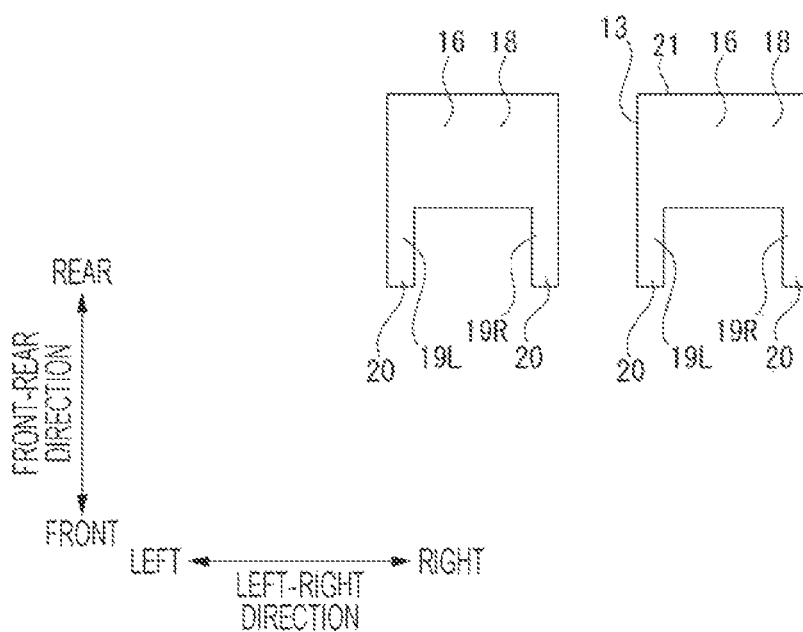
FIG. 6 is an end view taken along line B-B in FIG. 3.

Next, the central portion 14 of the back cover 8 will be described with reference to FIGS. 3, 6, and 7.

The central portion 14 of the back cover 8 includes the plurality of linear portions 16 provided apart from each other in the left-right direction and a plurality of connecting portions 22 provided apart from each other in the up-down direction. That is, the plurality of connecting portions 22 and 22 is provided between two adjacent linear portions 16 and 16, and the strength of the linear portion 16 is improved.

Figure 7:
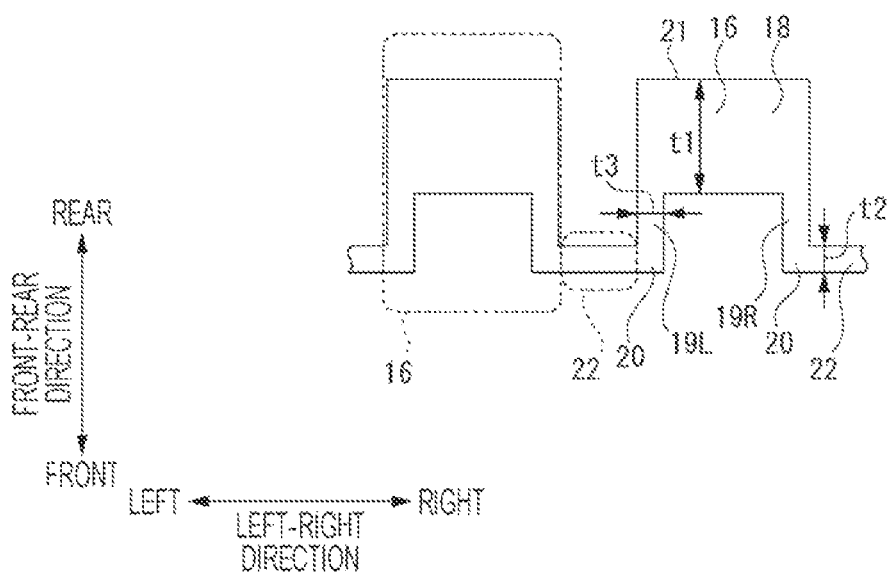
FIG. 7 is an end view taken along line C-C in FIG. 3.

As illustrated in FIG. 7, the connecting portion 22 has a shape similar to the connection portion 17 in the horizontal cross section. That is, the connecting portion 22 has a rectangular parallelepiped shape extending in the left-right direction, and both left and right end portions thereof are respectively continuous with the tip portion 20 of the protrusion 19R of the linear portion 16 and the tip portion 20 of the protrusion 19L of the linear portion 16 which are adjacent to each other.

The plurality of connecting portions 22 is provided to be apart from each other in the up-down direction.

A space surrounded by the linear portions 16 and 16 adjacent to each other in the left-right direction and the connecting portions 22 and 22 adjacent to each other in the up-down direction is formed as the intake and exhaust hole 13. Heat generated from an electronic substrate or the like disposed inside the outer casing portion 5 can be released to the outside through the intake and exhaust holes 13. Therefore, excellent heat dissipation can be secured in the display device 1.

Note that a space surrounded by the linear portions 16 and 16 adjacent to each other in the left-right direction, the end portion of the connection portion 17, and the connecting portion 22 is also formed as the intake and exhaust hole 13.

Next, the length and thickness of each portion of the back cover 8 will be described (see FIGS. 3 and 7). The thickness of the base 18 in the front-rear direction is defined as a thickness t1. The thickness of the connecting portion 22 in the front-rear direction is defined as a thickness t2. The thickness of the protrusion 19 in the left-right direction is defined as a thickness t3. A pitch width between the connecting portions 22 and 22 in the up-down direction is defined as a pitch width a. The length of the connecting portion 22 in the left-right direction is defined as a length b.

In the present embodiment, for example, the thickness t1 is larger than the thickness t2 and the thickness t3. Furthermore, the thickness t2 and the thickness t3 are the same.

Moreover, the pitch width a is larger than the length b.

Note that conditions under which these thickness and length are to be satisfied will be described later again.

<3. Molding Process of Back Cover in Injection Molding>

As described above, the back cover 8 is formed by injection molding using a molten resin.

Hereinafter, a process in which each portion of the back cover 8 is formed by injection molding will be described in chronological order (see FIGS. 8 to 15).

Figure 8:
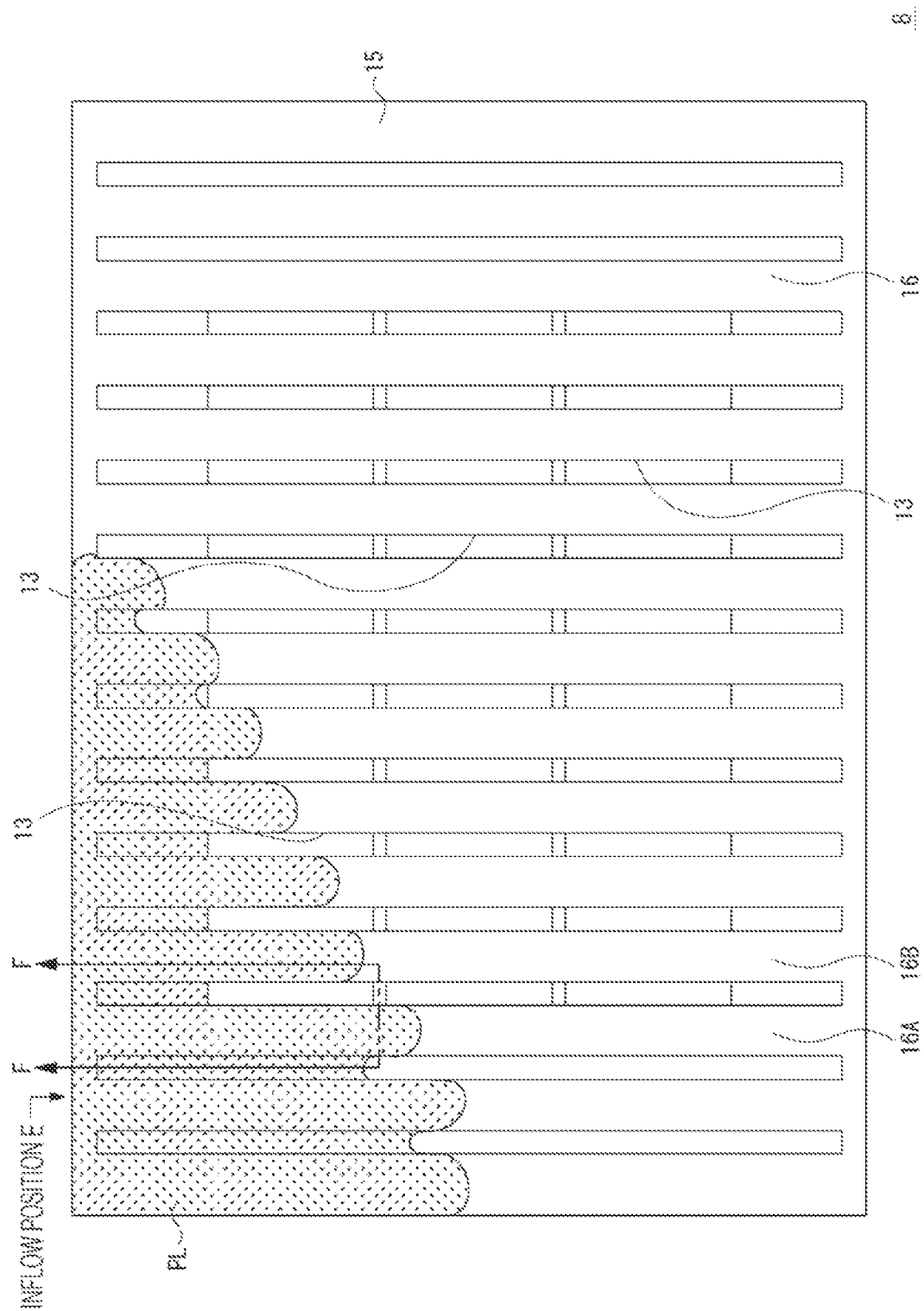
FIG. 8 is a rear view illustrating a process in which the back cover is formed using a molten resin.

FIG. 8 is a diagram illustrating a state where a molten resin PL flows in from an inflow position E to form the illustrated portion in the back cover 8. The inflow position E is, for example, a portion closest to a gate (not illustrated)

in the portion illustrated in FIG. 8. Note that the inflow position E illustrated in FIG. 8 is merely an example, and can be arbitrarily set according to the position of the gate provided in the back cover 8.

Furthermore, the number of inflow positions E is not necessarily one, and a plurality of inflow positions E may be provided.

Note that the gate when the back cover 8 is formed by injection molding may be provided at any position. Furthermore, the number of gates may be one or more.

Note that in each of the following drawings, a positional relationship between the back cover 8, which is a final molded product, and the molten resin PL (a satin portion in the drawings) at that time is illustrated. Furthermore, a flow state of the molten resin in an internal space (cavity) of a mold cut along an alternate long and short dash line F-F illustrated in FIG. 8 and the like will be described.

As illustrated in FIGS. 8 and 9, the molten resin PL is caused to flow in advance in a space forming the linear portion 16A closer to the inflow position E than a space forming the linear portion 16B.

As described above, the thickness t1 of the base 18 in the front-rear direction is larger than the thickness t3 of the protrusion 19 in the left-right direction. Therefore, a speed at which the molten resin PL flows in the front-rear direction in a space where the protrusion 19 is made faster than a speed at which the molten resin PL flows in the up-down direction in a space where the base 18 is formed. Therefore, there is a state where the molten resin flows into the base 18 and the molten resin does not flow into the protrusion 19. Therefore, the time until the molten resin PL reaches a space forming the connecting portion 22 can be delayed, and a weld line W can be easily formed in the connecting portion 22.

Figure 10:
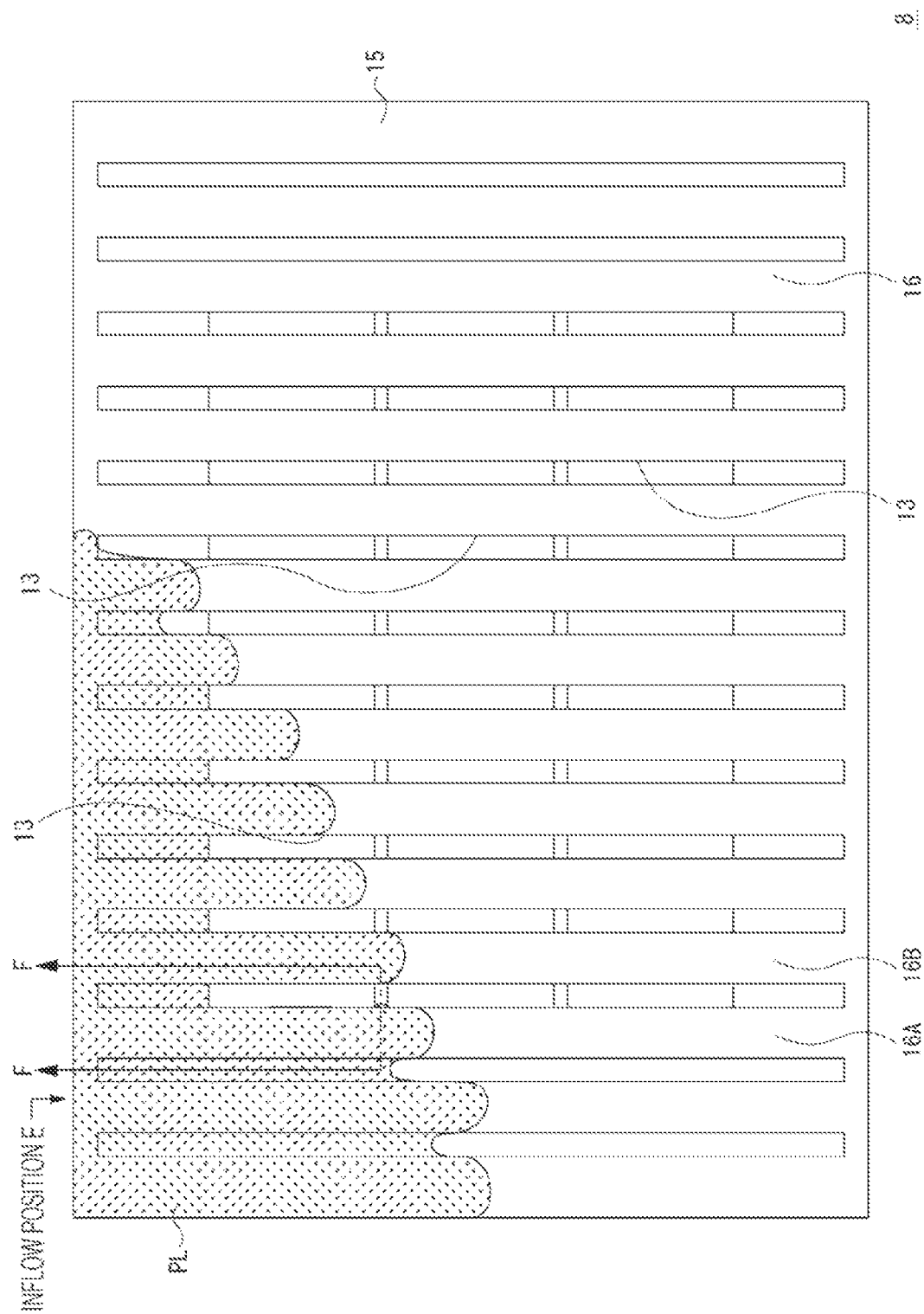
FIG. 10 is a rear view illustrating a process subsequent to FIG. 8 in which the back cover is formed using the molten resin.

Subsequently, as illustrated in FIGS. 10 and 11, the molten resin PL flows from the space forming the linear portion 16A toward the space forming the connecting portion 22 via the space forming the protrusion 19R, and flows from the space forming the base 18 of the linear portion 16B toward the space forming the protrusion 19L.

Figure 12:
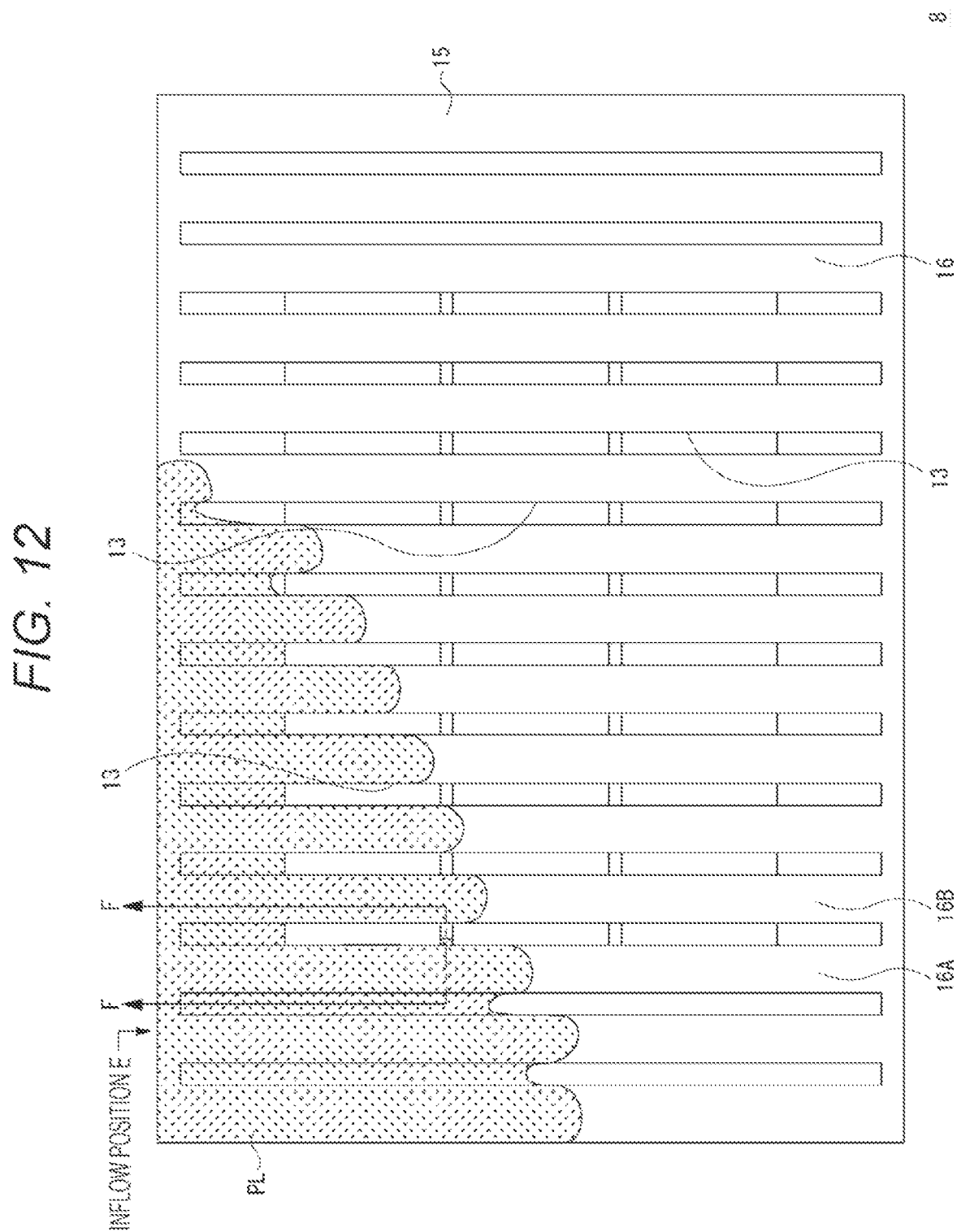
FIG. 12 is a rear view illustrating a process subsequent to FIG. 10 in which the back cover is formed using the molten resin.

Subsequently, as illustrated in FIGS. 12 and 13, the molten resin PL flows through to the space forming the connecting portion 22 from the space forming the linear portion 16A, and flows from the space forming the protrusion 19L toward the space forming the connecting portion 22.

Figure 14:
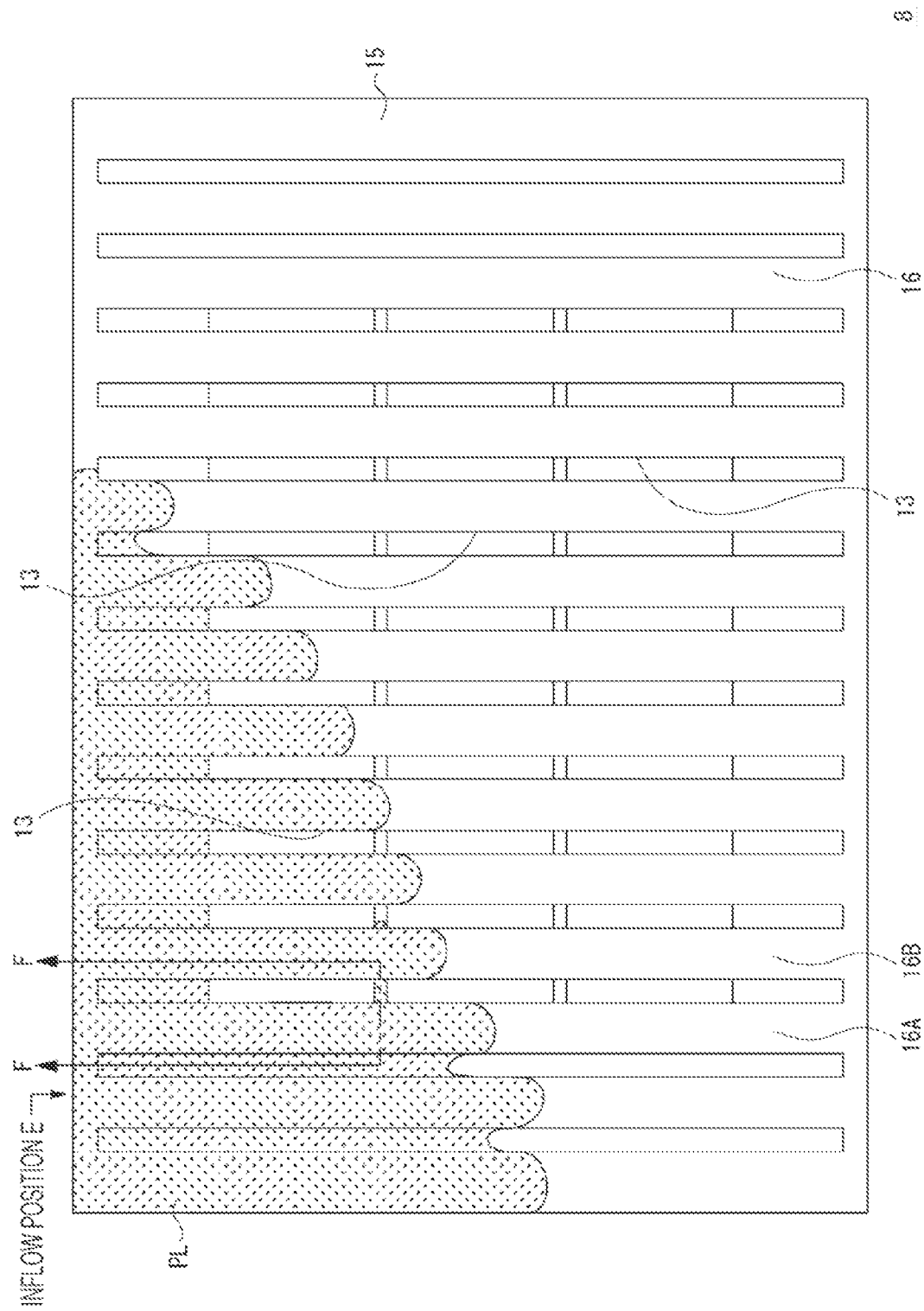
FIG. 14 is a rear view illustrating a process subsequent to FIG. 12 in which the back cover is formed using the molten resin.

Subsequently, as illustrated in FIGS. 14 and 15, the molten resin PL is joined in the space forming the connecting portion 22. Therefore, the weld line W of the molten resin PL is formed in the space forming the connecting portion 22.

As described above, the thickness t1 of the base 18 in the front-rear direction is larger than the thickness t2 of the connecting portion 22 in the front-rear direction. Therefore, a speed (see FIGS. 13 and 15) at which the molten resin PL flows in the left-right direction in the space forming the connecting portion 22 is made slower than the speed (see FIGS. 12 and 14) at which the molten resin PL flows in the up-down direction in the space forming the base 18.

Therefore, the weld line W can be easily formed in the connecting portion 22.

Note that the thickness t2 of the connecting portion 22 in the front-rear direction and the thickness t3 of the protrusion 19 in the left-right direction may be the same.

In order to form the junction of the molten resin PL in the connecting portion 22, it is conceivable to reduce either the thickness t3 of the protrusion 19 or the thickness t2 of the connecting portion 22. In a case where only one of the thicknesses t2 and t3 is reduced, the strength of a portion where the thickness is reduced is reduced, and breakages or cracks are likely to occur.

When the thickness t2 of the connecting portion 22 is made to be the same as the thickness t3 of the protrusion 19, the connecting portion 22 and the protrusion 19 can be formed to have a certain thickness as compared with a case where only one of the thicknesses t2 and t3 is reduced. Therefore, the flow rate of the molten resin PL at the time of forming the protrusion 19 and the connecting portion 22 can be reduced while securing the strength of the protrusion 19 and the connecting portion 22, and the durability of the back cover 8 can be improved.

Note that as illustrated in each drawing, the base 18 is positioned on the outer surface side (rear side) of the connecting portion 22. Therefore, the connecting portion 22 where the weld line W is easily formed is positioned closer to the internal space side of the display device 1 than the linear portion 16.

Therefore, an impact is less likely to be applied to the connecting portion 22 where the weld line W is likely to be formed, and thus the breakages and cracks caused by the weld line W are less likely to occur, and the durability of the back cover 8 can be improved. Furthermore, in a case where the base 18 serves as the outer surface 21 of the display device 1, an impact may be applied to the base 18 in the impact test. In such a case, since the weld line W is not formed in the base 18, it is easy to pass the impact test, and a countermeasure becomes unnecessary. Therefore, the occurrence of unnecessary man-hours can be suppressed.

<4. Pressure Loss of Molten Resin>

The flow rate of the molten resin PL during injection molding corresponds to the magnitude of the pressure loss generated when the molten resin PL flows inside the mold. Specifically, the flow rate decreases as the pressure loss increases.

A pressure loss $\Delta P$ is calculated by following Expression (1).

$$\Delta P = 12\mu LQ/(wt^3) \qquad \text{Expression (1)}$$

$\mu$ represents the viscosity of the molten resin PL. L represents a flow distance. Q represents the flux of the molten resin PL. w represents the width of a flow path through which the molten resin PL flows. t represents the thickness of the flow path.

Hereinafter, a specific example of the pressure loss related to the back cover 8 will be described using the pitch width a in the up-down direction of the plurality of connecting portions 22 positioned apart from each other in the up-down direction and the length b in the left-right direction of the connecting portion 22.

In order to form the weld line W in a portion other than the linear portion 16, it is required that before the molten resin PL forming the linear portion 16 (the linear portion 16A in FIG. 9) finishes forming the connecting portion 22, the molten resin PL flowing through the adjacent linear portion 16 (the linear portion 16B in FIG. 9) finishes forming the base 18.

In order to satisfy this condition, the time for forming the base 18 of the linear portion 16 over the pitch width a needs to be shorter than the time for forming the connecting portion 22 over the length b.

A pressure loss $\Delta P1$ of the molten resin PL when the base 18 of the linear portion 16 is formed over the pitch width a can be expressed by following Expression (2) (see FIG. 16).

$$\Delta P1 = 12\mu aQ/(w \times t1^3) \qquad \text{Expression (2)}$$

Furthermore, a pressure loss ΔP2 when the molten resin PL flows from one end to the other end of the connecting portion 22 can be expressed by following Expression (3) (see FIG. 16).

$$\Delta P2 = 12\mu bQ/(w \times t2^3) \qquad \text{Expression (3)}$$

In order to form the weld line W in the connecting portion 22, the pressure loss ΔP1 is required to be smaller than the pressure loss ΔP2.

That is, following Expression (4) is derived from Expressions (2) and (3).

$$(t1/t2)^3 > a/b \qquad \text{Expression (4)}$$

By satisfying above Expression (4), during injection molding, the molten resin PL flows into the connecting portion 22 from the bases 18 of the adjacent linear portions 16 before the molten resin PL at the time of forming the base 18 forms the entire connecting portion 22. Therefore, the weld line W is not formed in the linear portion 16, and thus the strength of the linear portion 16 can be improved.

Note that various combinations of variables t1, t2, a, and b satisfying Expression (4) can be considered. However, the value of the variable t1 is the thickness of the base 18 in the front-rear direction, and is naturally determined by design considering the strength and weight of the back cover 8. Furthermore, the value of the variable a is the pitch width between the connecting portions 22 and 22 in the up-down direction, and is naturally determined in consideration of the size of the intake and exhaust hole 13. Moreover, the value of the variable b is the length of the connecting portion 22 in the left-right direction, and is naturally determined in consideration of the size of the intake and exhaust hole 13.

Therefore, on the basis of the values of the variables t1, a, and b, the value of the variable t2 is derived as a value less than a predetermined value from Expression (4).

In order to form the weld line W in the connecting portion 22, the variable t2 needs to be less than the predetermined value in order to satisfy Expression (4), but on the other hand, in consideration of the durability of the back cover 8 and the like, the thickness t2 of the connecting portion 22 in the front-rear direction cannot be made excessively small, and the variable t2 is desirably made as large as possible.

Therefore, conditions for increasing the value of the thickness t2 will be described below.

In the display device 1, it is most desirable to form the weld line W in the connecting portion 22 in order to secure the high strength of the back cover 8, but it is also allowable to form the weld line W in the protrusion 19 or the connecting portion 22 which is a portion other than the base 18. It is possible to secure the sufficient strength of the back cover 8 even in a case where the weld line W is formed in the protrusion 19, and it is possible to increase the value of the variable t2 as follows by relaxing Expression (4) which is a condition for forming the weld line W in the protrusion 19 to a condition for forming the weld line W in the protrusion 19 or the connecting portion 22.

In order to form the weld line W in the protrusion 19 or the connecting portion 22, the total value of the pressure loss of the molten resin PL when the protrusion 19 of the linear portion 16 is formed and the pressure loss ΔP2 of the molten resin PL when the connecting portion 22 is formed is only required to be larger than the pressure loss ΔP1.

That is, as illustrated in FIG. 17, when a path through which the molten resin PL flows from the space forming the protrusion 19R of the linear portion 16A through the space forming the connecting portion 22 to the space forming the protrusion 19L of the linear portion 16B is defined as a path G, the pressure loss ΔP3 of the molten resin PL flowing through the path G is only required to be larger than the pressure loss ΔP1.

Here, when only one of the thickness t2 of the connecting portion 22 in the front-rear direction and the thickness t3 of the protrusion 19 in the left-right direction is reduced, there is a possibility that the strength of the portion where the thickness is reduced is excessively reduced. Thus, it is desirable that the thickness t2 of the connecting portion 22 in the front-rear direction and the thickness t3 of the protrusion 19 in the left-right direction have the same thickness.

The pressure loss ΔP3 in a case where the thickness t2 and the thickness t3 have the same value is expressed by the following expression.

$$\Delta P3 = 12\mu b'Q/(w \times t2^3) \qquad \text{Expression (5)}$$

b' is a path length of the path G and can be expressed by following Expression (6).

$$\begin{aligned} b' &= 2c - t2 + b + t3 & \text{Expression (6)} \\ &= 2c - t2 + b + t2 \\ &= 2c + b \end{aligned}$$

In order to form the weld line W in the portion on the path G, that is, the protrusion 19 or the connecting portion 22, the pressure loss ΔP3 is only required to be larger than the pressure loss ΔP1, and thus following Expression (7) can be derived from Expressions (2), (5), and (6).

$$(t1/t2)^3 > a/b'$$

$$(t1/t2)^3 > a/(2c+b) \qquad \text{Expression (7)}$$

From Expressions (4) and (7), the possible values of the thickness t2 are expanded as follows.

Since c>0, (2c+b) is a value larger than b, and a/(2c+b) in Expression (7) is a value smaller than a/b.

In contrast to Expression (4), Expression (7) indicates that (t1/t2) may be a smaller value.

Therefore, it is possible to set t2 to a larger value than that in Expression (4) by Expression (7).

By determining the thickness t2 on the basis of Expression (7), the thickness t2 of the protrusion 19 and the connecting portion 22 can be further increased, so that the strength of the protrusion 19 and the connecting portion 22 can be improved. Furthermore, during injection molding, after the molten resin PL when forming the base 18 of the linear portion 16A forms the protrusion 19R and the connecting portion 22, the molten resin PL flows from the base 18 of the adjacent linear portion 16B into the protrusion 19L before forming the protrusion 19L of the adjacent linear portion 16B. That is, in the cavity of the mold, the molten resins PL flowing from the space forming each of the adjacent linear portions 16 toward the space forming the connecting portion 22 positioned therebetween are joined at the connecting portion 22 or the protrusion 19. Therefore, the weld line W is not formed in the linear portion 16, and thus the strength of the linear portion 16 can be further improved.

Note that when the pitch width a of the connecting portion 22 is made to be larger than the length b of the connecting portion 22, the space surrounded by the linear portion 16 and the connecting portion 22 is formed as an elongated intake and exhaust hole 13. Therefore, it is possible to suppress intrusion of a finger, a foreign substance, or the like into the display device 1 from the elongated intake and exhaust hole 13.

Note that here, it has been described that the condition of the thickness t2 can be relaxed using a variable other than the thickness t2 as a constant, but the condition of the variable other than the thickness t2 can be relaxed by changing the combination of variables to be constant.

<5. Exemplary Dimensions>

Figure 18:
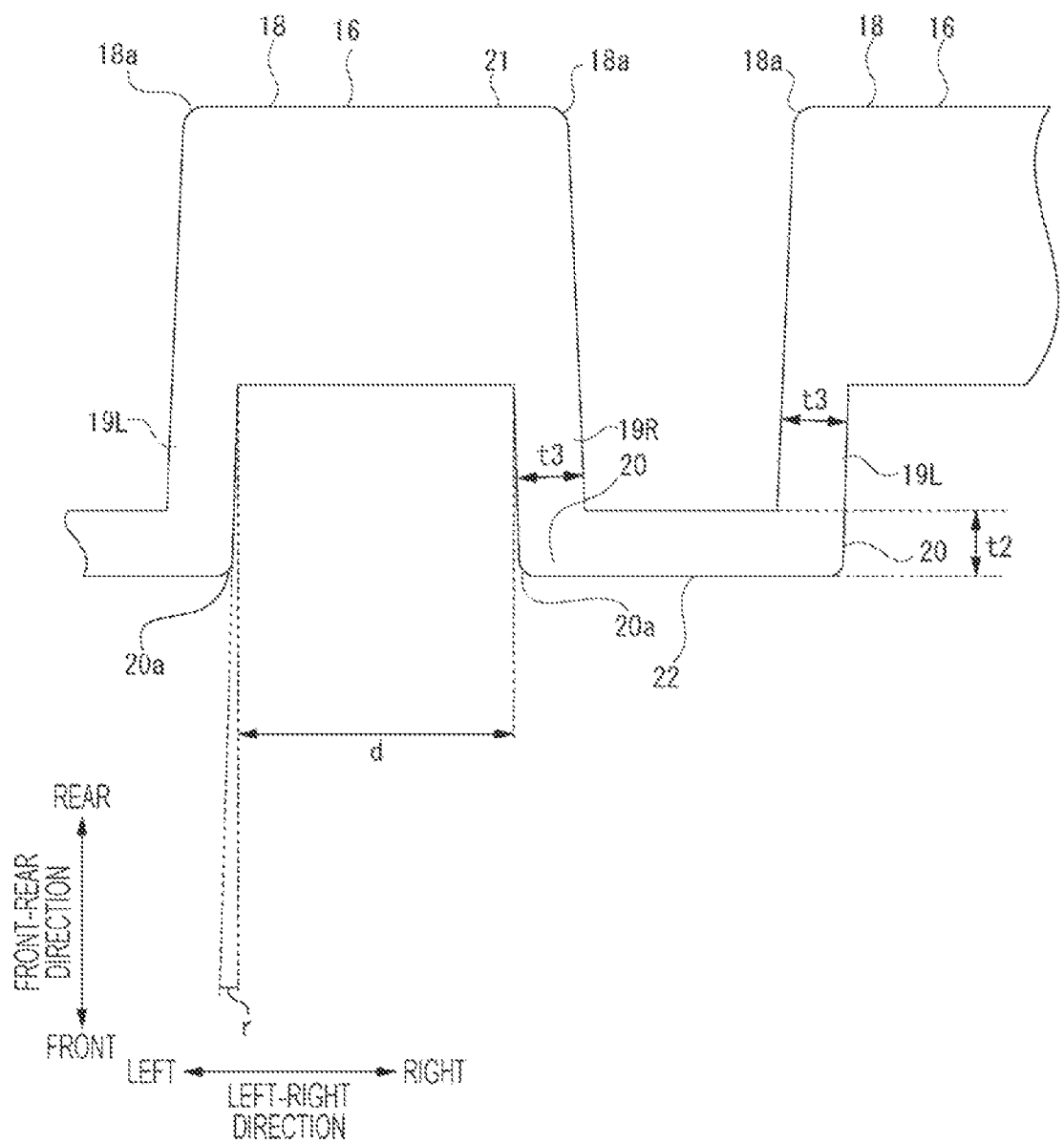
FIG. 18 is a schematic view illustrating exemplary dimensions.

FIG. 18 illustrates exemplary dimensions of the linear portion 16 and the connecting portion 22.

The left and right end portions of the rear end portion of the base 18 are formed as corner portions 18*a*, respectively. Furthermore, the inner end portions of the tip portions 20 and 20 of the protrusions 19L and 19R are formed as inner corner portions 20*a* and 20*a*, respectively.

First, a distance d between the portions, which are continuous with the base 18, of the protrusion 19L and the protrusion 19R protruding from one base 18 is desirably made to a value equal to or more than 2.3 times the thickness t2 of the connecting portion 22 and the thickness t3 of the protrusion 19.

The thickness t2 of the connecting portion 22 and the thickness t3 of the protrusion 19 are difficult to form to less than 1 mm in view of ease of injection molding. In this regard, for example, assuming that the thickness t2 of the connecting portion 22 and the thickness t3 of the protrusion 19 are 1 mm, the distance d is desirably 2.1 mm or more.

Therefore, the speed of the molten resin at the time of forming the protrusion 19 and the connecting portion 22 is sufficiently slower than the speed of the molten resin PL at the time of forming the base 18, and the weld line W is easily formed in a portion other than the base 18.

The corner portion 18*a* and the inner corner portion 20*a* are desirably subjected to R chamfering in order to prevent chipping and the like. It is desirable that the corner portion 18*a* is subjected to the R chamfering with a radius of 0.5 mm to 1 mm, for example, and the inner corner portion 20*a* is subjected to the R chamfering with a radius of 0.3 mm, for example.

Note that the corner portions at both ends of the rear end portion of the connecting portion 22 are formed to have 180 degrees or more, and chipping and the like hardly occur, so that it is not necessary to perform the R chamfering.

Similarly, since the corner portions provided at the continuous portion between the base 18 and the protrusions 19 are also formed to have 180 degrees or more, it is not necessary to perform the R chamfering.

Moreover, in order to easily perform a step of releasing the back cover 8 as a molded product from the mold, it is desirable that an angle r formed by the direction in which the protrusion 19 extends and the front-rear direction be larger than 0 degrees. The angle r is, for example, 0.5 degrees or more.

Next, an example of possible numerical values of the variables t1, t2, a, and b used in above-described Expression (4) will be described.

The maximum value of the pitch width a of the connecting portion 22 in the up-down direction is desirably set to a predetermined value or less such that the strength of the linear portion 16 is not reduced. Furthermore, from the viewpoint of exhaust heat efficiency, the pitch width a is desirably set to a predetermined value or more. For example, the pitch width a is 3 mm or more and 30 mm or less.

The length b of the connecting portion 22 in the left-right direction is desirably set to a predetermined value or less in order to prevent entry of a finger or the like through the intake and exhaust hole 13. Furthermore, from the viewpoint of exhaust heat efficiency, the length b is desirably set to a predetermined value or more. For example, the length b is 1 mm or more and 30 mm or less.

The thickness t1 of the base 18 in the front-rear direction is desirably set to a predetermined value or more from the viewpoint of ease of injection molding. Furthermore, the thickness t1 is desirably set to a predetermined value or less from the viewpoint of weight and cost. For example, the thickness t1 is 0.5 mm or more and 4 mm or less.

The thickness t2 of the connecting portion 22 in the front-rear direction is desirably set to a predetermined value or more from the viewpoint of ease of injection molding. Furthermore, the thickness t2 is desirably set to a predetermined position or less from the viewpoint of weight and cost. For example, the thickness t2 is 0.5 mm or more and 4 mm or less.

In order to form the weld line W in a portion other than the base 18 of the linear portion 16, the relationship between the thicknesses t1 and t2 is important. That is, it is desirable that the thicknesses t1 and t2 are set to satisfy above Expressions (4) and (7) while satisfying the condition of 0.5 mm or more and 4 mm or less, respectively.

<6. Modification>

A modification of the configuration of the linear portion 16 and the connecting portion 22 forming the intake and exhaust holes 13 will be described.

The linear portion 16 in this example is a linear portion 16C in which an inclined surface is formed in a part of the base 18.

A specific description will be given with reference to FIG. 19.

FIG. 19 illustrates one linear portion 16C and a plurality of connecting portions 22 extending from the linear portion 16C in the left-right direction. Furthermore, FIG. 19 illustrates a cross-sectional view of the linear portion 16C and the connecting portion 22, and an end view in a plane H orthogonal to the up-down direction as an end view of a portion where the connecting portion 22 is not positioned.

The linear portion 16C has a base 18C and the protrusions 19L and 19R.

The base 18C includes a protruding portion 24 which is a rear portion and a base portion 25 which is a portion in front of the protruding portion 24.

The protruding portion 24 is formed in a rectangular horizontal cross-sectional shape, and the base portion 25 is formed such that a horizontal cross-sectional shape is an isosceles trapezoidal shape and a width in the left-right direction is larger than that of the protruding portion 24.

The outer surfaces of the base portion 25 in the left-right direction are formed as inclined surfaces 26 and 26 which approach each other as approaching the protruding portion 24.

When the inclined surface 26 is formed on the linear portion 16C in this manner, the angle of the corner portion 27 at the portion where the rear surface of the base portion 25 and the inclined surface 26 are continuous is made larger than the right angle, and the corner portion 27 is made difficult to be chipped.

Furthermore, in a case where the linear portion 16C and the connecting portion 22 are formed in the process of injection molding, the cross-sectional area of the space where the continuous portion between the base 18C and the protrusion 19 is formed is reduced. Specifically, a width t4' of the root of the protrusion 19 in a case where the inclined surface 26 is formed is shorter than a width t4 (=t2) of the root of the protrusion 19 in a case where the inclined surface 26 is not formed.

Therefore, it is difficult for the molten resin PL to flow from the base 18C of the linear portion 16C to the protrusions 19L and 19R. That is, the time required for the molten resin PL to reach the connecting portion 22 is lengthened, and the weld line W is more easily formed in the connecting portion 22. Furthermore, in the mold releasing process of the injection molding, the molded product and the mold can be easily separated, and a work efficiency can be improved.

The inclined surface 26 is provided only in a portion of the linear portion 16 continuous with the connecting portion 22 and a portion in the vicinity thereof, and is not formed in a portion between the adjacent connecting portions 22 and 22 as illustrated in the end view of FIG. 19.

Furthermore, the protrusions 19L and 19R are formed such that a portion in the vicinity of the connecting portion 22 is a wide portion 28 having a wide width in the left-right direction, and the other portion is a narrow portion 29 having a narrower width in the left-right direction than the wide portion 28.

Therefore, in a case where the molten resin PL flows, for example, from the upper side to the lower side when forming the linear portion 16C, the flow rate at the time of forming the narrow portion 29 is reduced as compared with a case where the narrow portion 29 is not formed. Therefore, the time until the molten resin PL flows into the wide portion 28 which is a portion in the vicinity of the connecting portion 22 is lengthened, and the possibility that the weld line W is formed in the connecting portion 22 can be increased.

Figure 20:
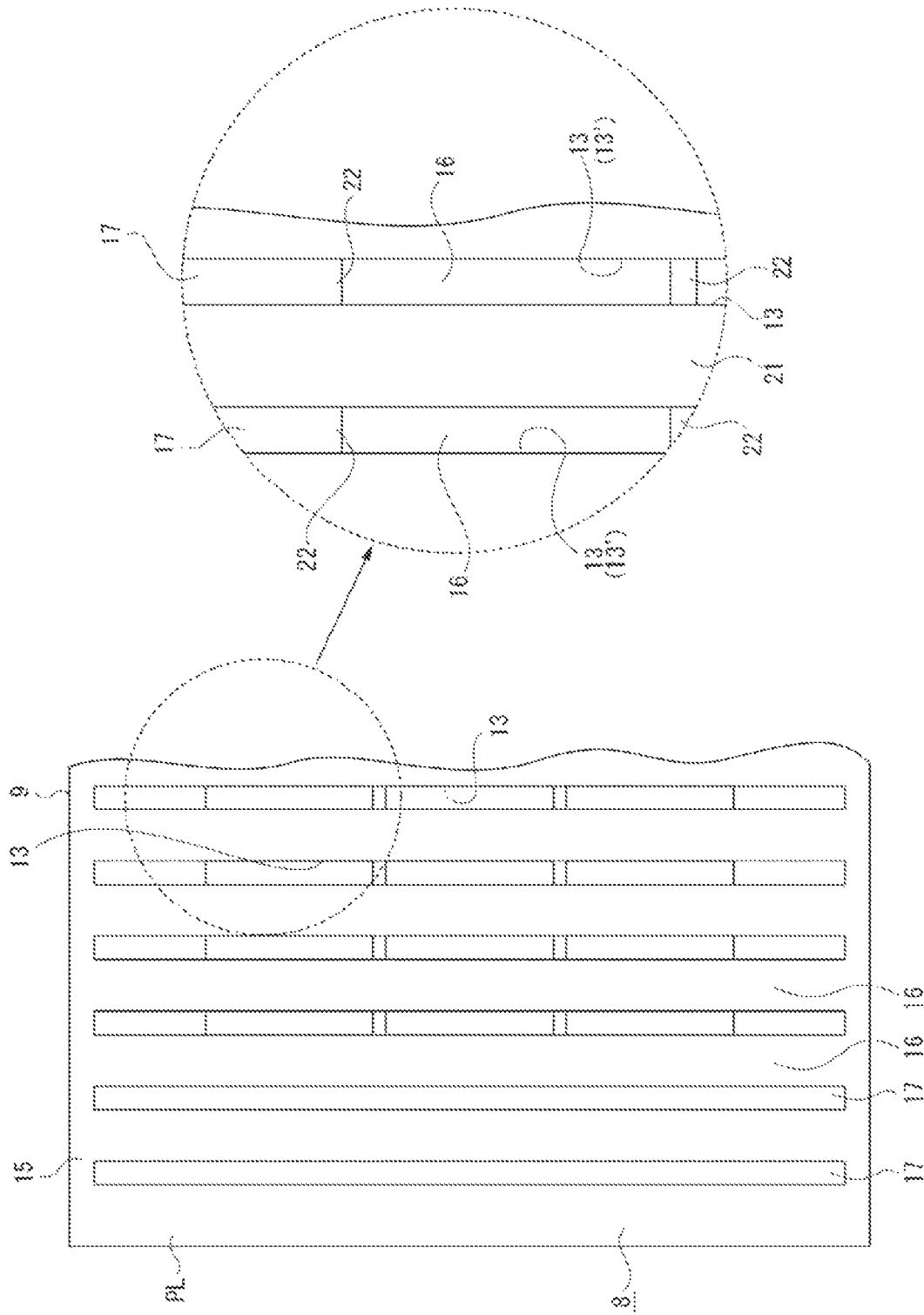
FIG. 20 is a view illustrating a state where one end of a connection portion is formed as the connecting portion.

Note that as illustrated in FIG. 20, the edge portion of the intake and exhaust hole 13 in the connection portion 17 may be formed as the connecting portion 22.

Therefore, every intake and exhaust hole 13 is formed by a pair of linear portions 16 and 16 adjacent to each other in the left-right direction and a pair of connecting portions 22 and 22 adjacent to each other in the up-down direction. That is, various functions and effects described above and later also apply to an intake and exhaust hole 13' formed by the pair of linear portions 16 and 16, one end portion of the connection portion 17 in the up-down direction, and the connecting portion 22.

Note that, in the above-described example, an example in which the display device 1 includes the back cover 8 in which the intake and exhaust hole 13 is formed has been described. However, the intake and exhaust hole 13 may be formed in a back cover, a side cover, or the like in an outer casing of another electronic device or the like. For example, in a case where a personal computer includes various substrates or devices such as a motherboard disposed in the internal space and an outer casing, the intake and exhaust hole 13 having the above-described features may be formed on the back surface and the side surface of the outer casing.

Furthermore, the hole formed by the linear portion and the connecting portion is not limited to the intake and exhaust hole, and the present technology can be applied to various structures formed in a lattice shape by injection molding in the display device 1. Note that although the example in which the connection portion 17 is formed on the outer peripheral portion 15 of the back cover 8 has been described above, the present technology can also be applied to a configuration in which the connection portion 17 is not formed on the outer peripheral portion 15.

<7. Summary>

As described in each of the above examples, in a case where three directions orthogonal to each other are the first direction (up-down direction), the second direction (left-right direction), and the third direction (front-rear direction), the back cover 8 of the display device 1 includes the plurality of linear portions 16 (16A, 16B, 16C) extending in the first direction (up-down direction) and positioned apart in the second direction (left-right direction), and the connecting portion 22 connecting respective parts of two linear portions 16 (16A, 16B, 16C) adjacent to each other in the second direction (left-right direction).

Furthermore, the linear portion 16 (16A, 16B, 16C) and the connecting portion 22 are integrally formed by injection molding, the linear portion 16 (16A, 16B, 16C) has the base 18 (18C) extending in the first direction (up-down direction) and the pair of protrusions 19 (19L, 19R) protruding in the third direction (front-rear direction) from both end portions of the base 18 (18C) in the second direction (left-right direction), and both end portions of the connecting portion 22 are continuous to respective tip portions 20 of the protrusions 19 (19L, 19R) of two adjacent linear portions 16 (16A, 16B, 16C).

Therefore, a hole (intake and exhaust hole 13) is formed between the linear portions 16 (16A, 16B, 16C). Furthermore, the flow rate of the molten resin PL at the time of forming the base 18 (18C) during injection molding is made higher than the flow rate of the molten resin PL at the time of forming the connecting portion 22. Therefore, the junction (weld line W) of the molten resin PL divided by the hole (intake and exhaust hole 13) is easily formed in the connecting portion 22.

Since the weld line W is formed in the connecting portion 22, the strength of the base 18 (18C) can be improved.

Furthermore, since a zigzag shape (bellows shape) is formed in which portions having a U-shaped cross section in the continuous portion of the linear portion 16 (16A, 16B, 16C) and the connecting portion 22 are combined alternately with each other, a tensile stress is less likely to occur in the connecting portion 22 in a case where an impact is applied to the base 18 (18C), and cracks and fractures are less likely to occur in the connecting portion 22. Therefore, the number of the back covers 8 failing the impact test is reduced, and a countermeasure is unnecessary.

Note that the effects described in this description are merely examples and are not limited, and other effects may be provided.

Furthermore, the above-described examples can be combined in any manner as long as the combination is not impossible.

<8. Present Technology>

The present technology can also adopt the following configurations.

(1) A display device including:
    a plurality of linear portions that, when three directions orthogonal to each other are a first direction, a second direction, and a third direction, extends in the first direction and is positioned apart from each other in the second direction; and
    a connecting portion that connects respective parts of two linear portions adjacent to each other in the second direction,
    in which the linear portion and the connecting portion are integrally formed by injection molding,
    the linear portion has a base extending in the first direction and a pair of protrusions protruding in the third direction from both end portions of the base in the second direction, and both end portions of the connecting portion are continuous to respective tip portions of the protrusions of the two adjacent linear portions.

(2) The display device according to (1),
in which a plurality of the connecting portions is provided apart from each other in the first direction.

(3) The display device according to (2),
in which a pitch width a of the connecting portions adjacent to each other in the first direction, a length b of the connecting portion in the second direction, a thickness t1 of the base in the third direction, and a thickness t2 of the connecting portion in the third direction satisfy a following expression:

$$(t1/t2)3 > a/b \qquad (4)$$

The display device according to (3),
in which the pitch width a is larger than the length b.

(5) The display device according to any one of (3) to (4),
in which the thickness t1 is larger than the thickness t2.

(6) The display device according to any one of (3) to (5),
in which the thickness t1 is larger than a thickness t3 of the protrusion in the second direction.

(7) The display device according to (6),
in which the thickness t2 and the thickness t3 are the same thickness.

(8) The display device according to any one of (1) to (7),
in which at least parts of outer surfaces of the linear portion on both sides in the second direction are formed as inclined surfaces which approach each other in the second direction with increasing distance from the connecting portion in the third direction.

(9) The display device according to any one of (1) to (8), further including:
a back cover that is disposed on a rear side of the display panel,
in which the linear portion and the connecting portion are provided in the back cover.

The display device according to (9), in which the base is positioned on an outer surface side of the connecting portion.

(11) The display device according to any one of (3) to (7),
in which a space surrounded by the adjacent linear portions and the connecting portions adjacent to each other in the first direction is formed as an intake and exhaust hole.

REFERENCE SIGNS LIST

1 Display device
8 Back cover
13, 13' Intake and exhaust hole
16, 16A, 16B, 16C Linear portion
18, 18C Base
19, 19L, 19R Protrusion
20 Tip portion
21 Outer surface
22 Connecting portion
26 Inclined surface
a Pitch width
b Length
t1, t2, t3 Thickness

The invention claimed is:
1. A display device comprising:
a plurality of linear portions that, when three directions orthogonal to each other are a first direction, a second direction, and a third direction, extends in the first direction and is positioned apart from each other in the second direction, the plurality of the linear portions forms a back cover;
a connecting portion that connects respective parts of two linear portions adjacent to each other in the second direction; and
a display panel positioned in front of the back cover in the third direction,
wherein the linear portion and the connecting portion are integrally formed by injection molding,
the linear portion has a base extending in the first direction and a pair of protrusions protruding in the third direction from both end portions of the base in the second direction,
a plurality of the connecting portions is provided apart from each other in the first direction such that both end portions of the connecting portion are continuous to respective tip portions of the protrusions of the two adjacent linear portions,
the back cover has two outer peripheral portions oriented in the first direction and separated from each other in the second direction, the two outer peripheral portions bracket the plurality of linear portions in the second direction, and
the back cover includes a central portion that comprises the linear portions and is surrounded by the outer peripheral portions.

2. The display device according to claim 1,
wherein at least parts of outer surfaces of the linear portion on both sides in the second direction are formed as inclined surfaces which approach each other in the second direction with increasing distance from the connecting portion in the third direction.

3. The display device according to claim 1
wherein the linear portion and the connecting portion are provided in the back cover.

4. The display device according to claim 3,
wherein the base is positioned on an outer surface side of the connecting portion.

5. The display device according to claim 1,
wherein the back cover comprises a series of exhaust holes.

6. The display device according to claim 1, further comprising:
a bezel that surrounds the display panel and positioned before the back cover in the third direction.

7. The display device according to claim 6,
wherein the bezel includes second exhaust holes.

8. The display device according to claim 7,
wherein the second exhaust holes are elongated and grouped into at least two groups in which each group includes multiple second exhaust holes which are parallel to one another.

9. The display device according to claim 1, further comprising:
a bezel that surrounds the display panel and positioned before the back cover in the third direction, wherein the bezel includes second exhaust holes.

10. The display device according to claim 9, further comprising:
an electronic substrate that generates heat,
wherein the electronic substrate is position between the display panel and the rear cover, and
the heat is exhausted through the exhaust holes and the second exhaust holes.

11. The display device according to claim 1, further comprising:
an electronic substrate that generates heat,
wherein the electronic substrate is positioned between the display panel and the rear cover, and
the heat is exhausted through the exhaust holes.

12. A display device comprising:
a plurality of linear portions that, when three directions orthogonal to each other are a first direction, a second direction, and a third direction, extends in the first direction and is positioned apart from each other in the second direction; and
connecting portions that connect respective parts of two linear portions adjacent to each other in the second direction,
wherein
the linear portion and the connecting portion are integrally formed by injection molding,
the linear portion has a base extending in the first direction and a pair of protrusions protruding in the third direction from both end portions of the base in the second direction,
the connecting portions is provided apart from each other in the first direction such that both end portions of the connecting portion are continuous to respective tip portions of the protrusions of the two adjacent linear portions, and
a pitch width a of the connecting portions adjacent to each other in the first direction, a length b of the connecting portion in the second direction, a thickness t1 of the base in the third direction, and a thickness t2 of the connecting portion in the third direction satisfy a following expression:

$$(t1/t2)3 > a/b.$$

13. The display device according to claim 12,
wherein the pitch width a is larger than the length b.

14. The display device according to claim 12,
wherein the thickness t1 is larger than the thickness t2.

15. The display device according to claim 12,
wherein the thickness t1 is larger than a thickness t3 of the protrusion in the second direction.

16. The display device according to claim 15,
wherein the thickness t2 and the thickness t3 are the same thickness.

17. The display device according to claim 12,
wherein a space surrounded by the adjacent linear portions and the connecting portions adjacent to each other in the first direction is formed as an intake and exhaust hole.

* * * * *